US005621678A

United States Patent [19]
Barnaby et al.

[11] Patent Number: 5,621,678
[45] Date of Patent: Apr. 15, 1997

[54] PROGRAMMABLE MEMORY CONTROLLER FOR POWER AND NOISE REDUCTION

[75] Inventors: Michael J. Barnaby, West Boylston; James W. Brissette, Worcester, both of Mass.

[73] Assignee: Digital Equipment Corporation, Maynard, Mass.

[21] Appl. No.: 422,237

[22] Filed: Apr. 13, 1995

[51] Int. Cl.$^6$ .................................................. G11C 5/02
[52] U.S. Cl. .................... 365/52; 365/226; 365/230.08
[58] Field of Search ........................... 365/52, 226, 227, 365/230.08

[56] References Cited

U.S. PATENT DOCUMENTS 5,241,643  8/1993  Durkin et al. .......................... 365/52

*Primary Examiner*—David C. Nelms
*Assistant Examiner*—F. Niranjan
*Attorney, Agent, or Firm*—Ronald C. Hudgens; Arthur W. Fisher; Mary M. Steubing

[57] ABSTRACT

A memory controller circuit for use in a computer system provides memory address and control signals to a single in-line memory module (SIMM) connector. The SIMM connector can hold a SIMM that has dynamic random access memories (DRAMs) mounted on one or both sides. The SIMM connector provides a channel of signals to both sides of the SIMM. A driver associated with each channel receives a memory address and control signal. Each driver either drives a buffered memory signal to the associated channel or is placed in a high impedance state, depending upon whether a SIMM is in the SIMM connector. If a SIMM is in the connector, the driver associated with one of the channels is placed in the high impedance state if it is determined that the SIMM is single-sided. A programmable disabling means provides a driver enable signal to each driver. When the driver enable signal is asserted, the corresponding driver is in an enabled state. A deasserted driver enable signal places the corresponding driver in a disabled state. The programmable disabling means can be programmed to selectively assert and deassert the driver enable signals, and, consequently, to enable and disable the corresponding drivers in response to whether a SIMM, single or double-sided, is present in the SIMM connector.

31 Claims, 27 Drawing Sheets

PROGRAMMABLE MEMORY CONTROLLER FOR POWER AND NOISE REDUCTION

BACKGROUND OF THE INVENTION

The invention is related to computer systems and particularly to memory controllers supporting multiple memory configurations.

Computer systems are usually constructed with main memory subsystems which may be configured with widely variable sizes. For example, a desktop computer system might be delivered with a main memory capacity of anywhere in the range of 1-Mbyte to 32-Mbyte, or a workstation or file server type of computer might be delivered with a main memory capacity of from 8-Mbyte to 128-Mbyte.

One of the preferred forms of DRAM memory packaging for systems requiring high density and variable capacity is the so-called SIMM or Single In-line Memory Module. This is an industry-standard package format employing pin assignments that are in conformance with the standards for DRAM SIMM modules in accordance with Solid State Products Engineering Council specifications. Computer systems using SIMMs provide multiple SIMM slots into which SIMMs of various capacities can be connected, either during manufacturing or during upgrade by an end-user.

Memory controllers driving industry standard SIMMs derive various standard memory address and control signals for accessing the DRAMs on the SIMMs. Memory configurations supporting many SIMMs have very large loading requirements when all SIMM slots are loaded; thus, a memory controller may derive and drive multiple versions of each signal in order to maintain signal integrity and edge rate requirements. It is, however, a common occurrence that, even though many SIMM slots exist in a particular computer system, many of these slots remain empty.

Current implementations of memory controllers and drivers for accessing DRAMs on SIMMs do not consider the hardware impacts of driving an unloaded (empty) SIMM slot. Unloaded signals are often driven, for example, during DRAM refresh cycles. For today's computer system implementations employing very high speed microprocessors such as the ALPHA™, the use of drivers capable of charging SIMM loads in excess of 250 picofarads source in excess of 200 milliamps short circuit current to comply with signal edge rate requirements. If a SIMM is not installed in a slot to which address and control signals are being driven by these high current drivers, signal rise and fall times decrease due to the substantial reduction in load capacitance. Although the magnitude of current flow is reduced with decreased capacitance, current transition requirements increase on both the driver signals and the device power and ground pins, inducing noise that can disrupt operation, possibly causing intermittent failures. In addition, the increased transition rates increase signal harmonic amplitudes, thereby adversely impacting Electromagnetic Compliance (EMC) test levels. Moreover, crosstalk between unloaded driver outputs and neighboring signals is increased due to the increased rate of change of current. Furthermore, rise and fall times may decrease on unloaded signals to the point where series dampening resistors are required to minimize reflections and ringing. This dampening, however, increases rise and fall times when the signals are fully loaded, causing a concomitant negative impact on system performance.

In addition to the disadvantageous effects of unloaded SIMM slots on high current drivers, power is wasted when branches of the memory controllers's state machines are actively producing timed signals for driving empty SIMM slots. These power considerations become important with the increase in industry wide consumer pressure for minimization of power consumption even during idle times. There is a need for memory control circuitry capable of driving multiple SIMMs which conserves power and which is not subject to the prior art inadequacies which result from driving unloaded SIMM slots.

SUMMARY OF THE INVENTION

In accordance with the present invention, there is provided an apparatus for providing memory address and control signals to single in-line memory module (SIMM) connectors in which either single-sided or double-sided SIMMs can be installed. Each connector provides a channel of signals for each side of a SIMM.

According to one aspect of the invention, there is provided a memory controller circuit producing memory address and control signals. Drivers are each associated with one of the channels. Each driver accepts as input one of the memory address and control signals, and either drives a buffered memory signal to the associated channel via a corresponding signal line when in an enabled state, or places the signal line in a high impedance state when in a disabled state. The drivers associated with the channels of a connector are placed in the high impedance state if it is determined by a processor that no SIMM is present in the connector. More particularly, the drivers associated with one of the channels of the connector are placed in the high impedance state if it is determined by the processor that a single-sided SIMM is present in the connector.

According to another aspect of the invention, the memory controller circuit includes memory controllers each associated with at least one channel. The memory controllers produce the address and control signals when in an enabled condition, and do not produce the signals when in a disabled condition. The memory controllers associated with the channels of a connector are placed in the disabled state if no SIMM is installed in the connector; or, the memory controller associated with one of the channels of the connector is placed in the disabled state if a single sided SIMM is installed in the connector.

According to one implementation, a processor determines whether a SIMM is present in a connector and, if so, whether the SIMM is single or double sided by executing software that checks memory locations associated with each channel to see if DRAMs are present there. If no SIMM is present, or if a single sided SIMM is present, a programmable disabling means is programmed by the processor to disable the drivers and memory controllers associated with the empty channels. The programmable disabling means provides driver enable signals coupled to the drivers. When a driver enable signal is asserted, drivers coupled to the driver enable signal are in the enabled state. When a driver enable signal is deasserted, drivers coupled to the driver enable signal are in the disabled state.

According to another implementation, the processor reads SIMM ID bits coupled between the connectors and processor readable register. The SIMM ID bits indicate for each connector whether a SIMM is present, and if so, whether it is single or double sided. The processor decodes the SIMM ID bits, and then programs the programmable disabling means to disable the drivers and memory controllers associated with the empty channels.

In certain cases, a decoder can be used to directly decode the SIMM ID bits and assert or deassert the appropriate driver enable signals in response to the decode.

Buffered memory address and control signals are thereby provided to SIMM connectors in such a way that no unloaded signals are driven during operation, thereby avoiding the disadvantageous effects of driving unloaded signals. The additional ability to disable memory controllers also has a number of advantages. First of all, disabling memory controllers associated with empty channels decreases overall power consumption. Secondly, the ability to disable particular memory controllers is especially useful for implementing a "powersaver" mode, wherein the state of a bank of memory is saved to disk. After saving the state of the bank of memory, the memory controller associated with that bank can be disabled according to the principles of the invention, thereby decreasing overall power consumption.

DETAILED DESCRIPTION OF THE PREFERRED EMBODIMENT

Figure 1:
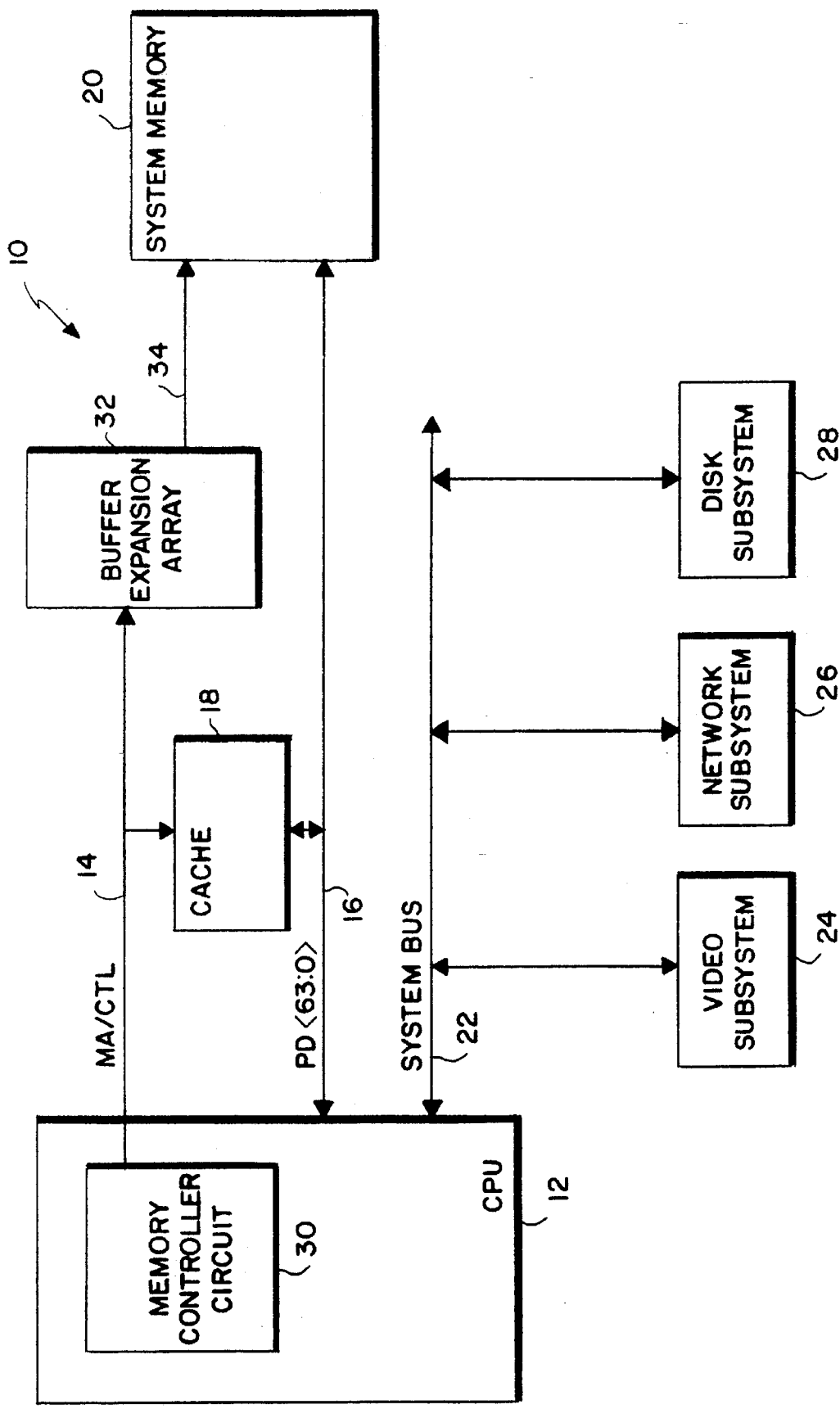
FIG. 1 is a block diagram of a computer system including a buffer expansion array according to the principles of the invention.

Referring now to FIG. 1 there is shown a computer system of the desktop or personal computer type in which the principles of the invention are incorporated. The computer system 10 includes a processor 12 coupled via memory address and control signals 14 and a processor data bus 16 to a cache memory 18 and a system memory 20. The processor 12 is further coupled via a system bus 22 to various peripheral devices supporting, among other things, a video subsystem 24, a network subsystem 26, and a disk subsystem 28.

The processor 12 employed in the particular system shown in FIG. 1 is an ALPHA microprocessor produced by Digital Equipment Corporation, Inc. This particular processor 12 includes a memory controller circuit 30 which produces the memory address and control signals 14 for controlling access to the system memory 20. A buffer expansion array 32 accepts the memory address and control signals 14 from the memory controller circuit 30 and produces buffered memory address and control signals 34 for driving the system memory 20.

Figure 2:
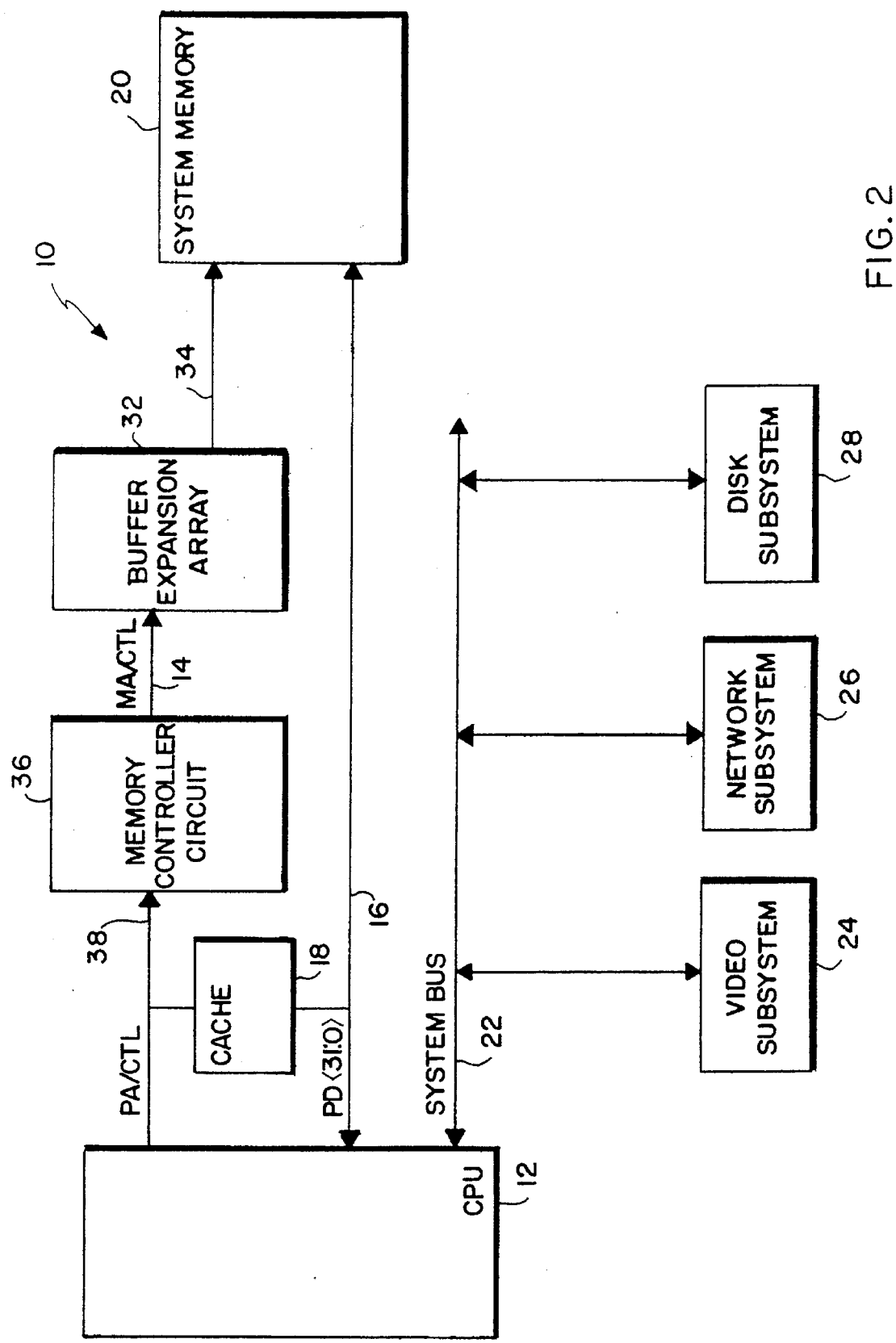
FIG. 2 is a block diagram of an alternate computer system employing an external memory controller.

It is understood, however, that any processor 12 can be used in the computer system 10 without departing from the basic principles of the invention. As is seen in FIG. 2, where the processor used does not include an on-board memory controller, an external memory controller circuit 36 is provided external to the processor 12. The external memory controller circuit 36 then accepts as input a processor address and control bus 38 from the processor 12, and produces as output the memory address and control signals 14 which are fed to the buffer expansion array 32.

Figure 3:
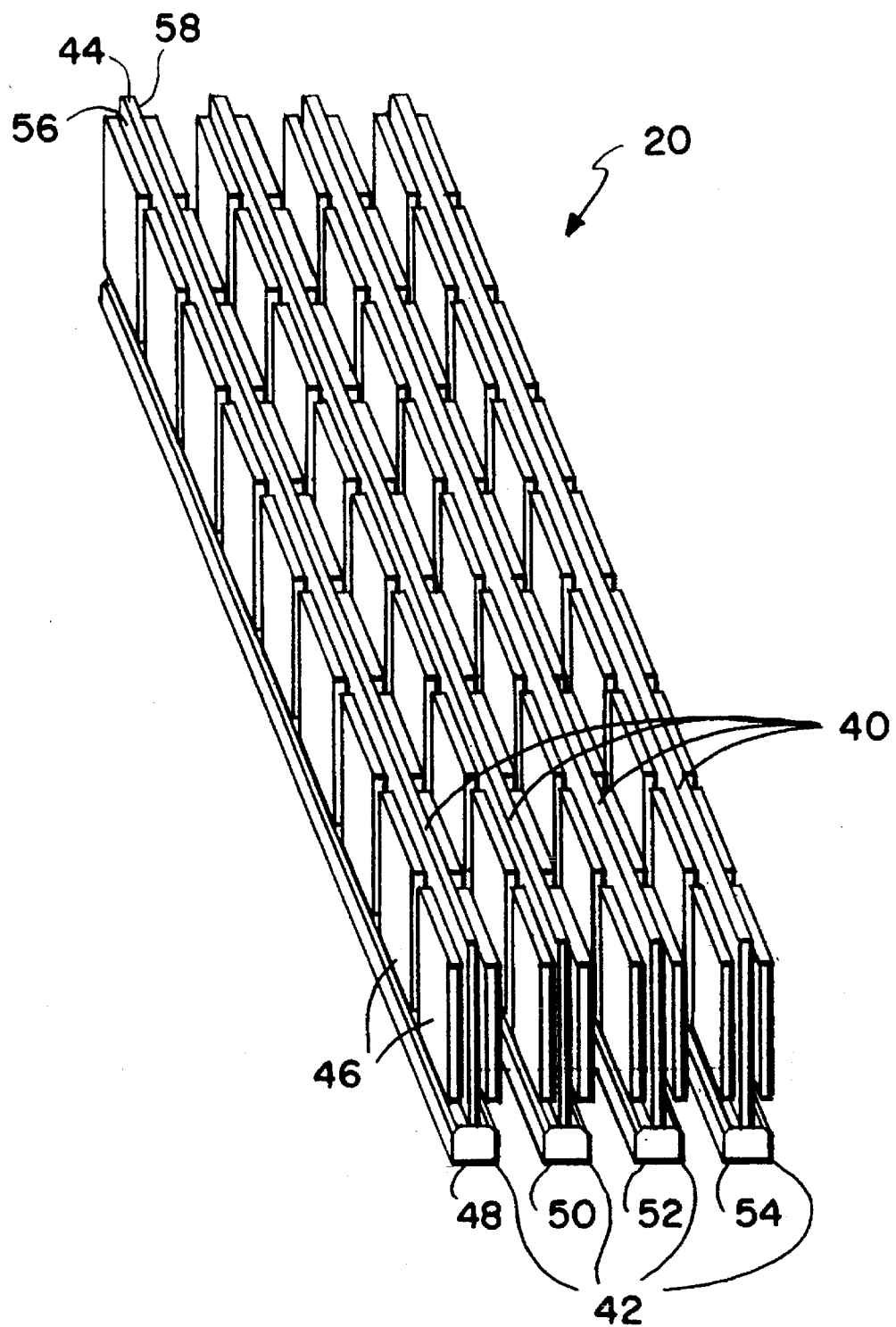
FIG. 3 is a perspective view of the SIMMs constituting the system memory of FIGS. 1 and 2.

Referring now to FIG. 3, there is shown the system memory 20 portion of the computer system 10 of FIGS. 1 and 2 in more detail. The system memory consists physically of Single In-Line Memory Modules (SIMMs 40) which plug into SIMM connectors or slots 42. The SIMMs are small printed wiring boards 44 having a row of dynamic RAM chips (DRAMs 46) mounted thereon. Though four slots 48, 50, 52, and 54 are shown, it is understood that any number of slots 42 might be provided for supporting larger system memories.

SIMMs 40 are available in a wide variety of configurations resulting in varying memory capacities. A typical industry standard SIMM used in the present embodiment has nine DRAMs 46 mounted on one side 56 providing a first bank of memory, and may have nine more DRAMs 46 mounted on the other side 58 and providing a second bank of memory. Eight of the nine DRAMs 46 on a side are used for data and one is used for parity and/or error correction codes (ECC). As implemented, the DRAMs 46 are "by four" (×4) DRAMs, meaning each DRAM 46 provides four data bit outputs. Thus, each bank of memory on a SIMM 40 provides 32 bits of data, and four bits used for byte-wise parity checking or ECC. The DRAMs 46 are presently available in a variety of capacities ranging from 1 Mbits (256K×4) to 16 Mbits (4M×4). Thus, a SIMM 40 having 9 256K×4 DRAMs 46 mounted on one side 56 thereof has a capacity of 1 Mbyte, while a SIMM 40 having 9 256K×4 DRAMs 46 mounted on each side 56 and 58 thereof has a capacity of 2 Mbytes. Likewise, a SIMM 40 having 9 4M×4 DRAMs 46 mounted on one side 56 thereof has a capacity of 16 Mbytes, while a SIMM 40 having 9 4M×4 DRAMs 46 mounted on each side thereof has a capacity of 32 Mbytes.

Figure 4:
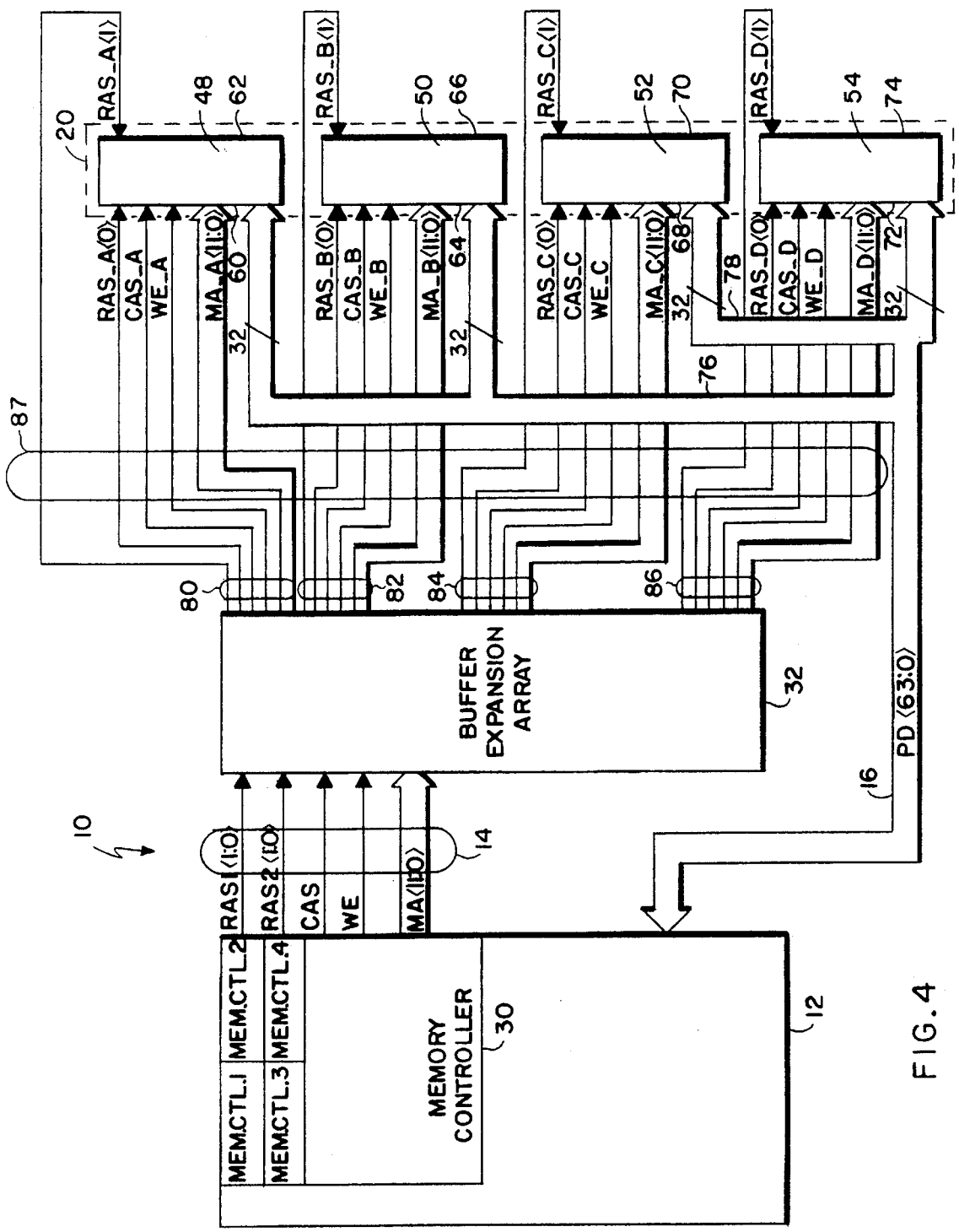
FIG. 4 is a block diagram of the CPU, buffer expansion array, and system memory of FIG. 1.

Referring now to FIG. 4 there is shown a more detailed representation of the interconnections between the processor 12 and the system memory 20 of the computer system 10 as shown in FIGS. 1 and 3. Since a given slot, for example slot 48, may be loaded with a SIMM 40 having DRAMs 46 on one side 56 or both sides 56 and 58 (FIG. 3), each slot 48, 50, 52, and 54 is provided with all the address, data, and control signals required to drive a two-sided SIMM 40 containing DRAMs 46 of the largest supported capacity. The group of signals that drive one side 56 or 58 of a slot will be herein referred to as a "channel". Thus, the system shown includes four slots and eight channels. Channels 60 and 62 are associated with slot 48; channels 64 and 66 are associated with slot 50; channels 68 and 70 are associated with slot 52; and channels 72 and 74 are associated with slot 54. Amongst the signals provided to each SIMM slot are:

MA<11:0>—multiplexed memory address. All 12 bits are required to fully address a SIMM 40 having 4M×4 DRAMs. MA<10:0> are used by SIMMs 40 having 1M×4 DRAMs. MA<9:0> are used by SIMMs 40 having 256K×4 DRAMs.

RAS<3:0>—Row Address Strobe—the RAS signals select the row being accessed within the DRAM 46. RAS<3> and RAS<1> are provided for driving the DRAMs 46 on one side 56 of a SIMM 40—i.e. the first channel—while RAS<2> and RAS<0> drive the DRAMs 46 on the other side 58, or the second channel, when a two sided SIMM 40 is installed. Two RAS signals are provided per side 56 or 58 in the event that the computer system 10 accesses the 32-bit memory with word resolution.

CAS<3:0>—Cas Address Strobe—the CAS signals select the column being accessed within the DRAM 46. Four CAS signals are provided per side 56 or 58 in the event that the computer system 10 accesses memory with byte resolution.

WE—Write Enable—the WE signal is active during writes to either side of the SIMM 40.

MD<31:0>—Data—a 32 bit memory data bus.

The processor 12 employed in the Computer system of FIG. 4 is an ALPHA microprocessor. The processor 12 includes the memory controller circuit 30, which is coupled to the buffer expansion array 32, which is in turn coupled to SIMM slots 48, 50, 52, and 54. The ALPHA microprocessor supports a 64 bit data bus; thus, the SIMM slots 48, 50, 52, and 54 are arranged in such a way that each memory access will access two 32 bit SIMMs at the same time, providing a 64 bit data transfer. As shown, one 64 bit data path 76 is provided between the processor 12 and the SIMM slots 48 and 50, and another 64 bit data path 78 is provided between the processor 12 and the SIMM slots 52 and 54.

The memory controller circuit 30 within the processor 12 actually contains four different memory controllers MEM_CTL_1, MEM_CTL_2, MEM_CTL_3, and MEM_CTL_4. Each is a separate state machine providing the proper timing to drive the memory address and control signals 14 for a given memory address space. The memory controller circuit 30 is programmable such that, by writing to addresses in the processor 12 address space which are mapped to certain registers within the processor 12, each of the four memory controllers MEM_CTL_1, MEM_CTL_2, MEM_CTL_3, and MEM_CTL_4 can be selectively enabled or disabled. Furthermore, each memory controller MEM_CTL_1, MEM_CTL_2, MEM_CTL_3, and MEM_CTL_4 can be programmed to drive the memory address and control signals 14 over a given CPU address range. Each controller provides a separate RAS signal, while the controllers share the remaining memory address and control signals 14. That is, when enabled, the memory controller MEM_CTL_1 drives memory control signals RAS1<0>, CAS, and WE, and memory address MA<11:0>. The memory controller MEM_CTL_2 when enabled drives the memory control signals RAS1<1>, CAS, and WE, and memory address MA<11:0>. The memory controller MEM_CTL_3, likewise, drives the RAS2<0> signal as well as the remaining memory address and control signals 14, and memory controller MEM_CTL_4 drives the RAS2<1> signal as well as the remaining memory address and control signals 14.

Each memory controller is associated with a pair of channels. That is, memory controller MEM_CTL_1 is associated with the channels 60 and 64, such that when the memory controller MEM_CTL_1 is enabled, a 64 bit memory access can occur to the first sides of SIMMs 40 plugged into the slots 48 and 50. Likewise, the memory controller MEM_CTL_2 is associated with the channels 62 and 66, such that when the memory controller MEM_CTL_2 is enabled, a 64 bit memory access can occur to the second sides of SIMMs 40 plugged into the slots 48 and 50. The memory controller MEM_CTL_3 is associated with the channels 68 and 72, such that when the memory controller MEM_CTL_3 is enabled, a 64 bit memory access can occur to the first sides of SIMMs 40 plugged into the slots 52 and 54. Finally, the memory controller MEM_CTL_4 is associated with the channels 70 and 74, such that when the memory controller MEM_CTL_4 is enabled, a 64 bit memory access can occur to the second sides of SIMMs 40 plugged into the slots 52 and 54. The various memory controllers are enabled or disabled in response to knowledge as to whether SIMMs are present in each slot 48, 50, 52 and 54, and as to whether those SIMMs are double sided or single sided.

The buffer expansion array 32 accepts as input the memory address and control signals 14 from the memory controller circuit 30 and generates as output four sets of buffered memory address and control signals 80, 82, 84, and 86 for driving each of the SIMM slots 48, 50, 52, and 54. Furthermore, each set of buffered memory address and control signals includes two RAS control signals: one per channel. Accordingly, as shown, the buffer expansion array 32 provides the signals RAS_A<1:0>, CAS_A, WE_A and MA_A<11:0> to the SIMM slot 48, where RAS_A<0> is fed to channel 60 and RAS_A<1> is fed to channel 62. The CAS_A, WE_A, and MA_A<11:0> signals are fed to both channels 60 and 62. Since the ALPHA microprocessor accesses 64 bits of data at a time, neither byte nor word resolution is required for a memory access. Therefore the RAS_A<0> signal drives the SIMM signals RAS<2> and RAS<0> for the channel 60 of the slot 48, while the RAS_A<1> signal drives the RAS<3> and RAS<1> signals for the channel 62 of the slot 48, and the CAS_A signal drives the CAS<3:0> signals.

Likewise, the signals RAS_B<1:0>, CAS_B, WE_B an MA_B<11:0> to the SIMM slot 50, where RAS_B<0> is fed to channel 64 and RAS_B<1> is fed to channel 66. In a like manner, the signals RAS_C<1:0>, CAS_C, WE_C an MA_C<11:0> are provided to the SIMM slot 52, and the signals RAS_D<1:0>, CAS_D, WE_D an MA_D<11:0> to the SIMM slot 54. The sets of buffered memory address and control signals 80, 82, 84, and 86 are driven to the slots 48, 50, 52, and 54 via signal lines 87.

The buffer expansion array 32 is programmable such that the signal lines 87 carrying any of the sets of buffered memory address and control signals 80, 82, 84, or 86 can be selectively placed in a high impedance state in response to a determination that no SIMM is plugged into the SIMM slot to which the signals correspond. Furthermore, the signal lines 87 carrying either of the RAS control signals within each set of buffered memory address and control signals can be placed in a high-impedance state in response to a determination that a SIMM is present in a slot but no DRAMs are present in the channel to which the RAS signal corresponds. For example, the signal line 87 carrying the RAS_A<1> signal can be placed in the high impedance state in the event that a single-sided SIMM is plugged into slot 48, and thus no DRAMs are present at channel 62. The problems associated with providing timed output signals to potentially unloaded channels are thereby avoided.

Figure 5:
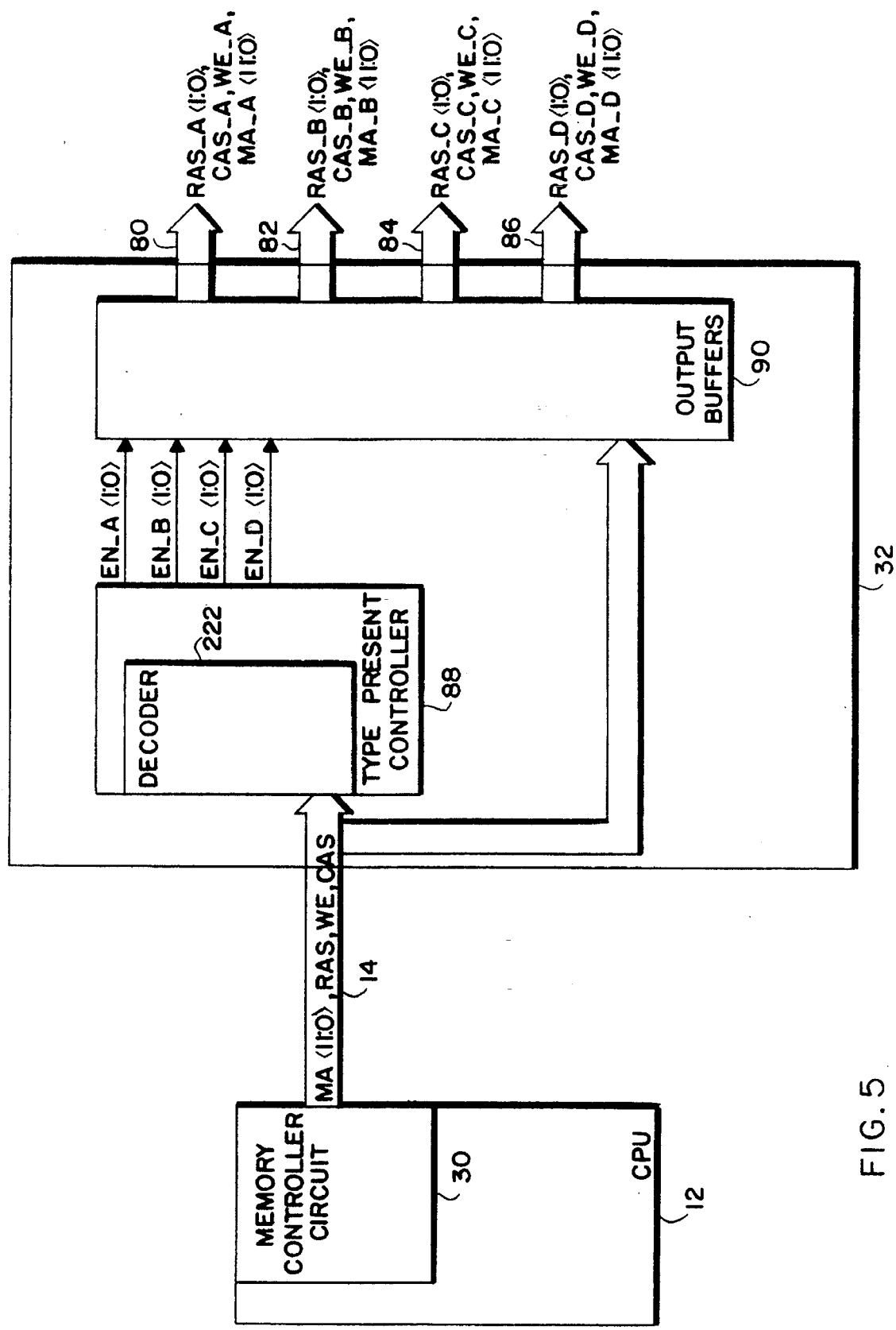
FIG. 5 is a block diagram of the buffer expansion array of FIG. 4.

Referring now to FIG. 5, the buffer expansion array 32 is shown to include a programmable SIMM type/present controller 88 and output buffers 90. The SIMM type/present controller 88 accepts as input the memory address and control signals 14 from the processor 12 and generates as output the enable signals EN_A<1:0>, EN_B<1:0>, EN_C<1:0>, and EN_D<1:0>, which are fed in turn to the output buffers 90. Each enable signal is associated with a particular channel; that is, EN_A<0> is associated with channel 60, EN_A<1> is associated with channel 62, enable signal EN_B<0> is associated with channel 64, enable signal EN_B<1> is associated with channel 66, EN_C<0> is associated with channel 68, EN_C<1> is associated with channel 70, enable signal EN_D<0> is associated with channel 72, and enable signal EN_D<1> is associated with channel 74.

The enable signals EN_A<1:0>, EN_B<1:0>, EN_C<1:0>, and EN_D<1:0> are input to the output buffers 90, as are the memory address and control signals 14 from the memory controller circuit 30. The output buffers 90 drive memory address and control signals 14 onto the four sets of buffered memory address and control signals 80, 82, 84, and 86 in response to the assertion of corresponding enable signals EN_A<1:0>, EN_B<1:0>, EN_C<1:0>, and EN_D<1:0>. On the other hand, when any of the enable signals EN_A<1:0>, EN_B<1:0>, EN_C<1:0>, and EN_D<1:0> are deasserted, the output buffers 90 place the signal lines 87 carrying the corresponding buffered memory address and control signals 80, 82, 84, and 86 in the high impedance state.

Figure 6:
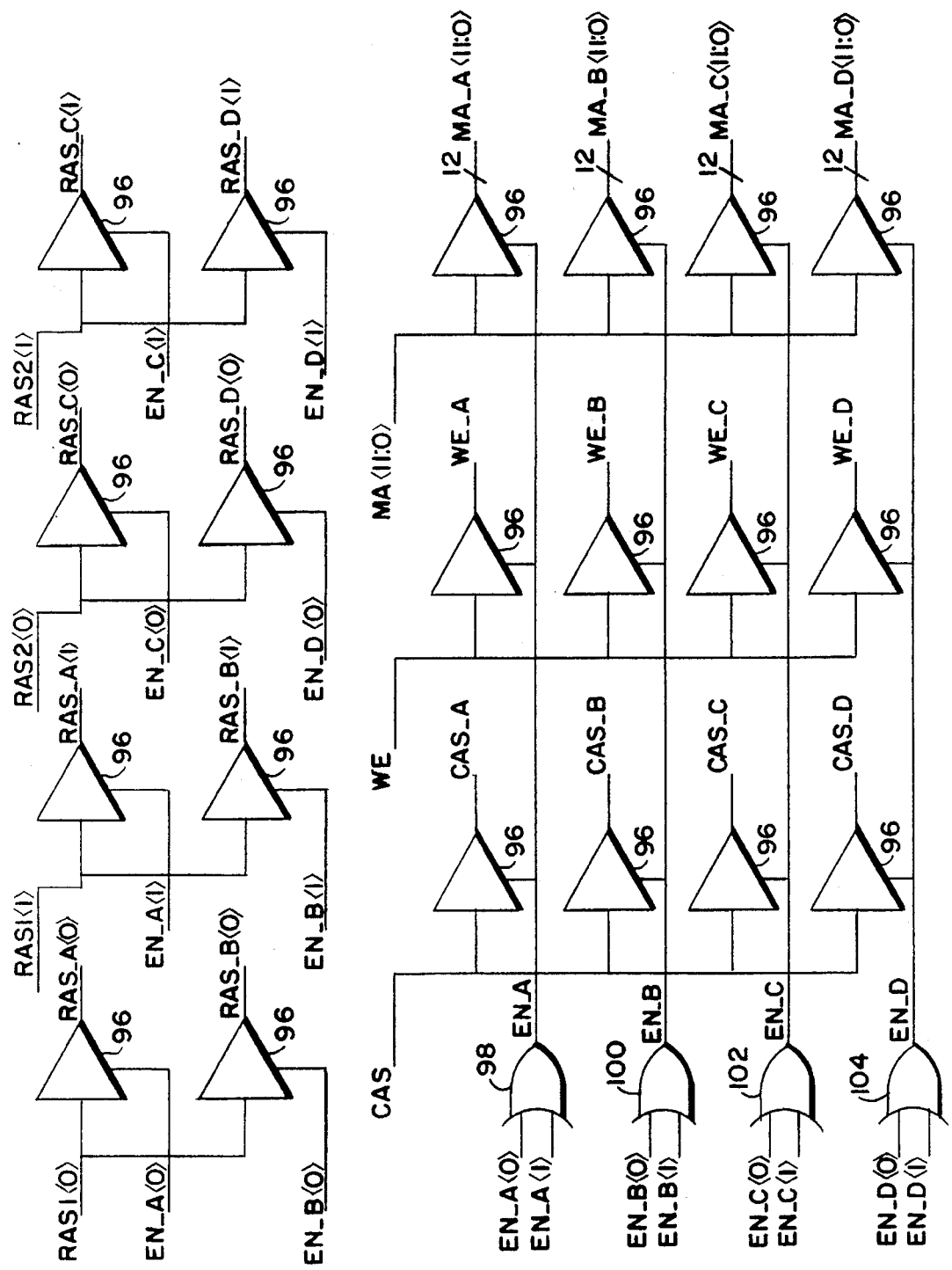
FIG. 6 is a schematic representation of the output buffers of FIG. 5.
Figure 7A:
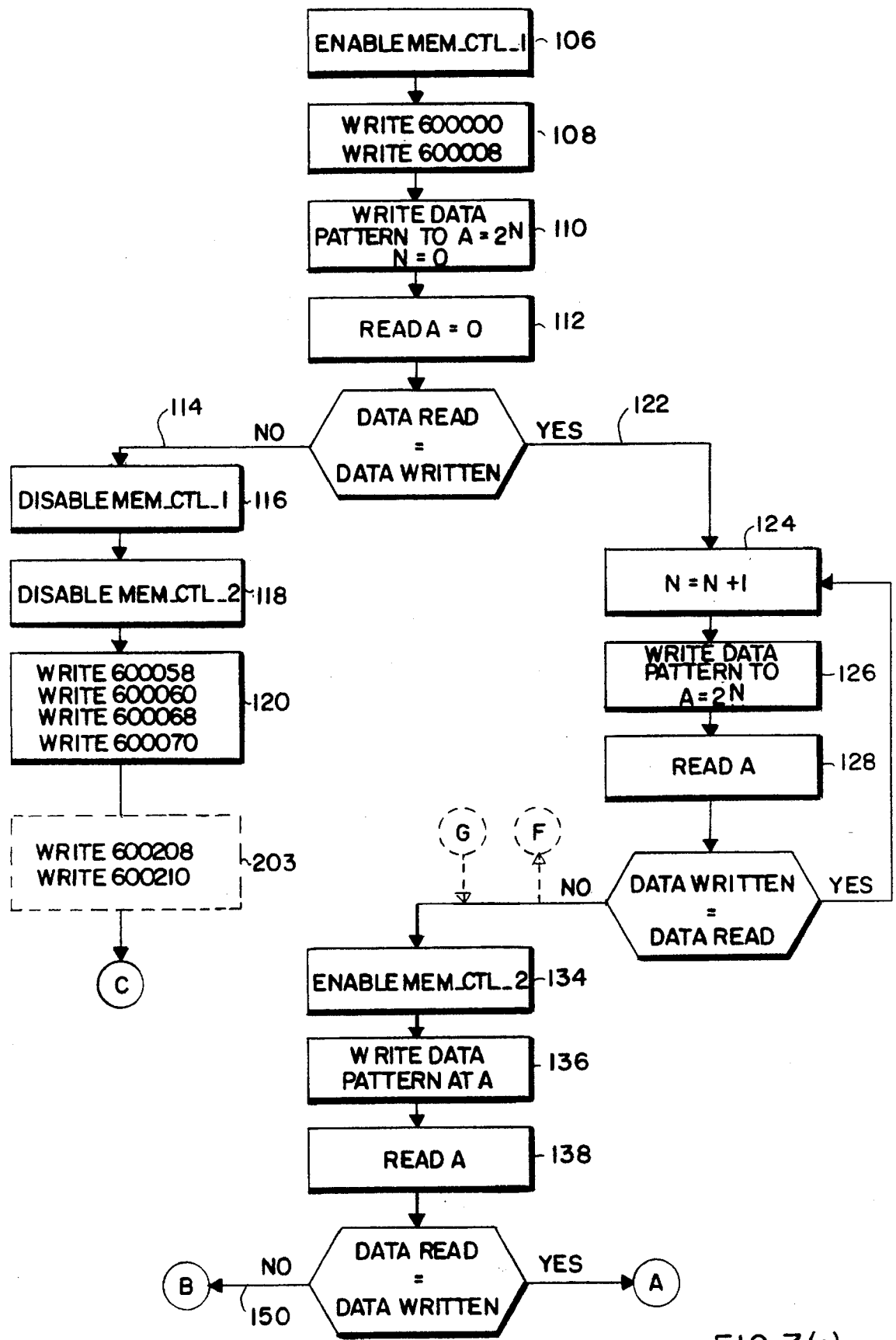
FIG. 7(a)–7(d) is a flow diagram of the operation of the type/present controller of FIG. 5.
Figure 7B:
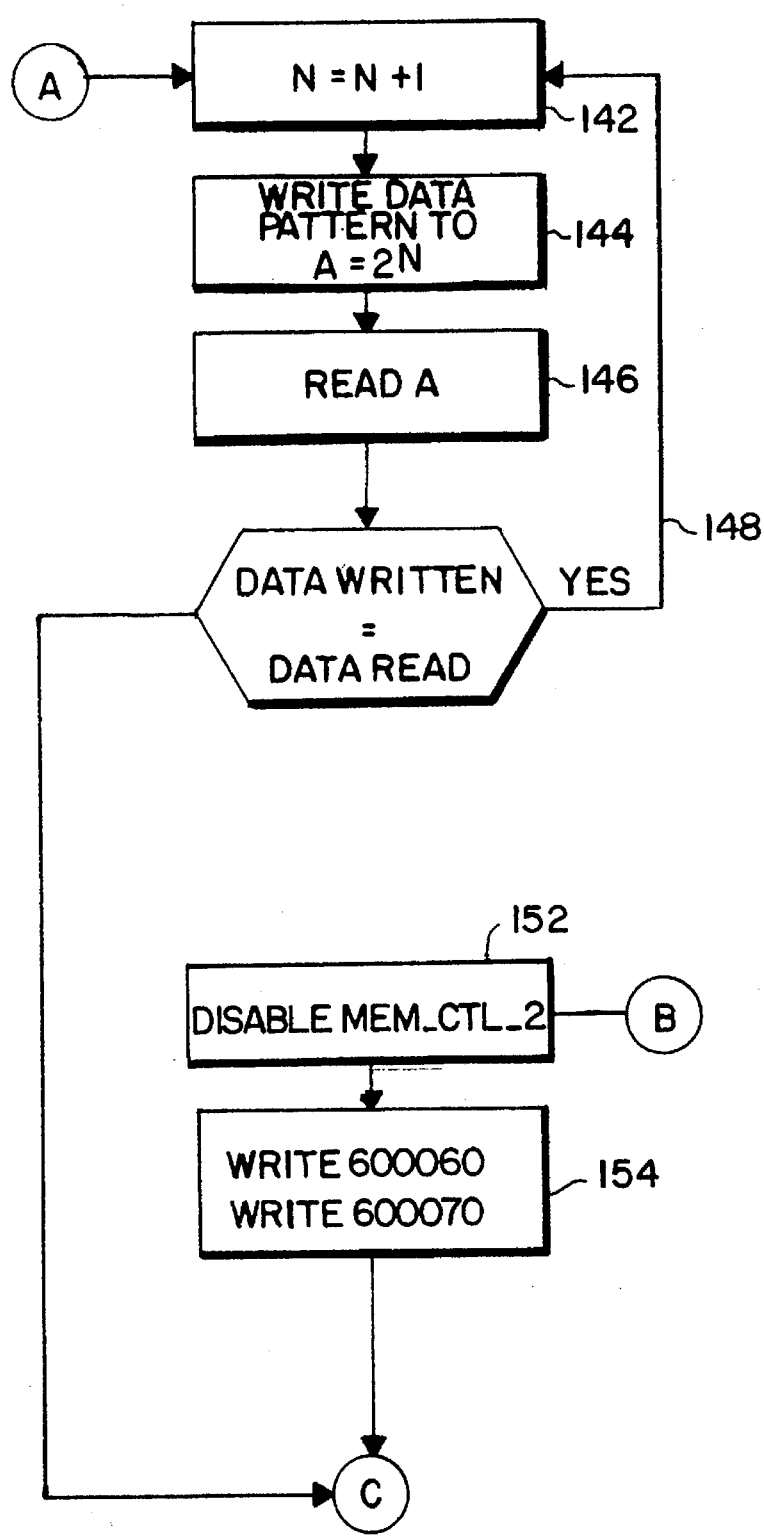
Figure 7C:
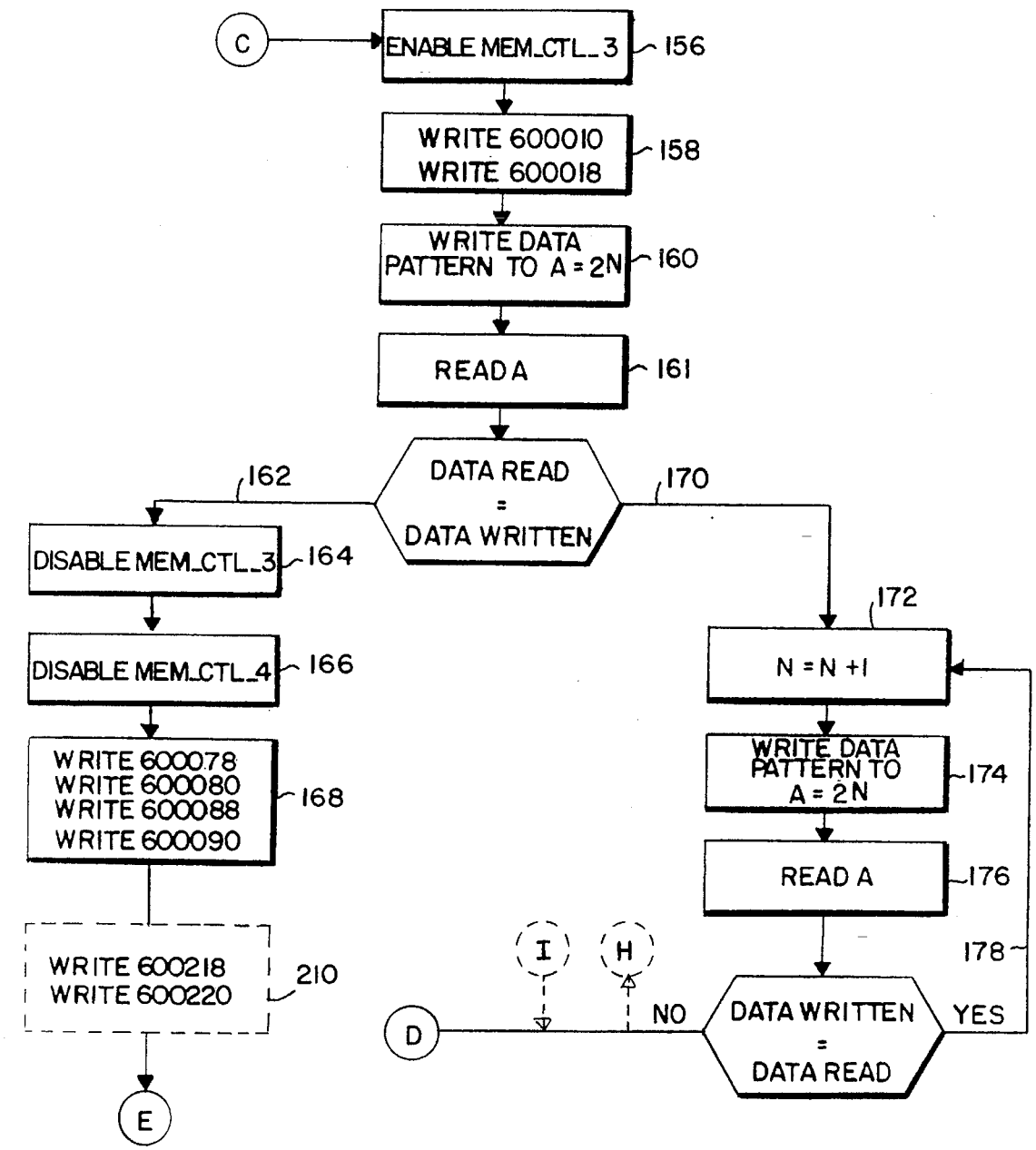
Figure 7D:
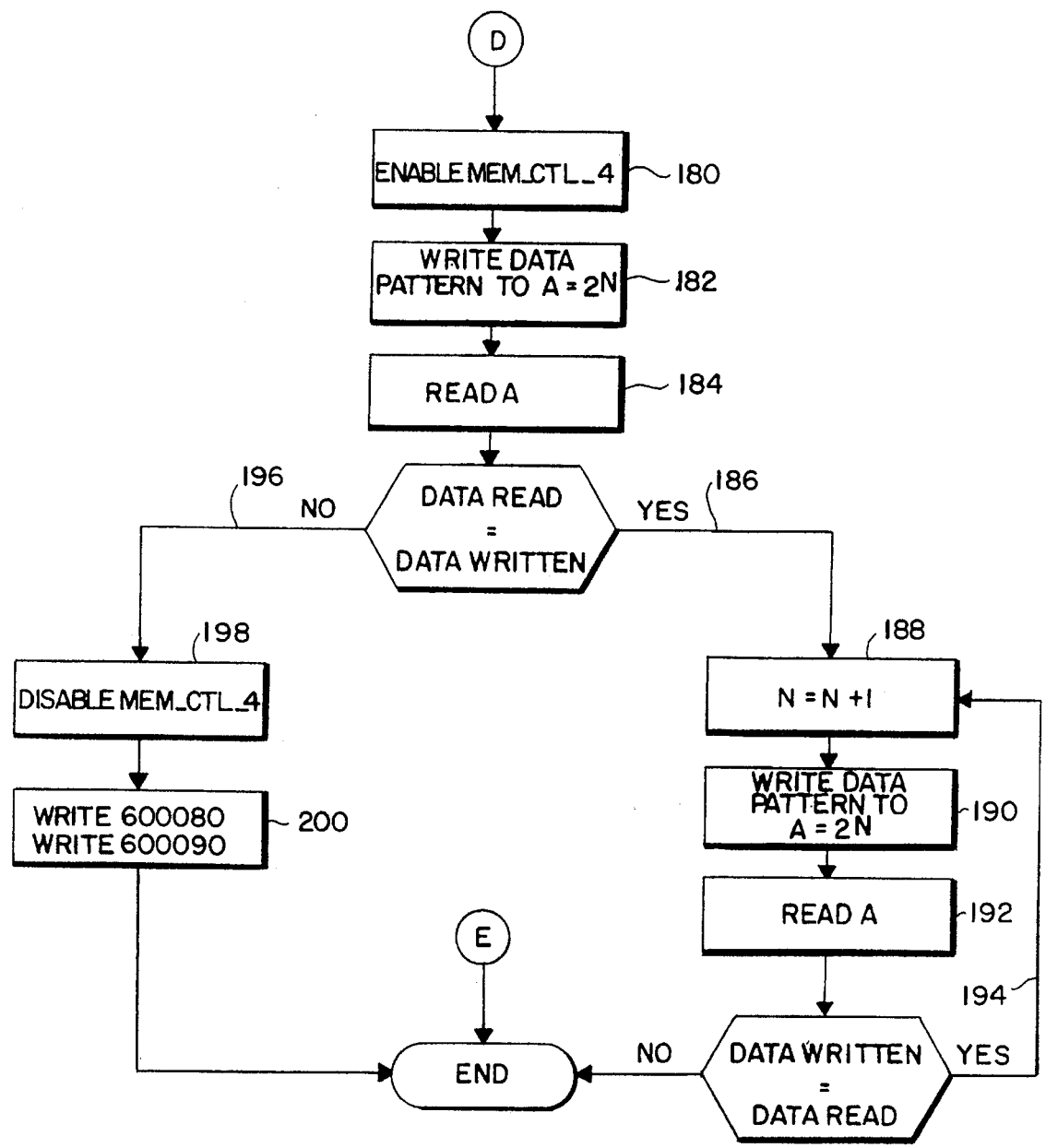

The output buffers 90 are shown in further detail in FIG. 6. The output buffers 90 contain three-state drivers 96. When the enable signal coupled to a driver 96 is asserted, the driver is in an "enabled state" in which it drives a buffered memory address and control signal. When on the other hand the enable signal coupled to the driver 96 is deasserted, the driver is in a "disabled state" wherein its output, and thus the signal line 87 to which it is coupled, is placed in a high-impedance state. For example, when the memory control signal RAS1<0> is asserted by the memory controller MEM_CTL_1, and the enable signals EN_A<0> and EN_B<0> are asserted, the RAS1<0> signal is driven onto the signals RAS_A<0> and RAS_B<0> to the channels 60 and 64 respectively via two of the drivers 96. Thus if SIMMs 46 are installed in slots 48 and 50, a memory access is initiated to the DRAMs on the front sides of those SIMMs 46. On the other hand, when the memory control signal RAS1<0> is asserted by the memory controller MEM_CTL_1, and the enable signals EN_A<0> and EN_B<0> are deasserted, the two associated drivers 96 are placed in a disabled state such that signal lines 87 carrying the signals RAS_A<0> and RAS_B<0> to the channels 60 and 64 respectively are placed in the high impedance state.

Likewise, when the RAS1<1> signal is asserted by the second memory controller MEM_CTL_2, and the enable signals EN_A<1> and EN_B<1> are asserted, the RAS1<1> signal is driven onto the RAS_A<1> and RAS_B<1> signals to the channels 62 and 66 respectively. When the RAS2<0> signal is asserted by the third memory controller MEM_CTL_3, and the enable signals EN_C<0> and EN_D<0> are asserted, the RAS2<0> signal is driven onto the RAS_C<0> and RAS_D<0> signals to the channels 68 and 72 respectively. Finally, when the RAS1<1> signal is asserted by the fourth memory controller MEM_CTL_4, and the enable signals EN_C<1> and EN_D<1> are asserted, the RAS2<1> signal is driven onto the RAS_C<1> and RAS_D<1> signals to the channels 70 and 74 respectively.

According to the implementation shown in FIG. 6, the remaining address and control signals in each of the four sets of buffered memory address and control signals 80, 82, 84, and 86 are driven to both channels of each slot. 'OR' gates 98, 100, 102, and 104 therefore logically 'OR' together the enable signals corresponding to the two channels of each slot to provide enable signals EN_A, EN_B, EN_C and EN_D. These enable signals enable corresponding drivers 96 to drive the remaining buffered memory address and control signals 80, 82, 84, and 86 respectively. Accordingly, the CAS signal is driven by an driver 96 onto the CAS_A signal to slot 48 and thus to channels 60 and 62 if either EN_A<0> or EN_A<1> is asserted. Likewise, the WE_A and MA_A<11:0> signals are driven if either EN_A<0> or EN_A<1> is asserted. As can be seen, the buffered address and control signals to the remaining slots 50, 52, and 54 are generated in the same manner from the corresponding enable signals EN_B, EN_C, and EN_D.

According to the implementation shown in FIG. 5, the programmable SIMM type/present controller 88 is programmed via the memory address and control signals 14 from the processor 12 such that the enable signals EN_A<1:0>, EN_B<1:0>, EN_C<1:0>, and EN_D<1:0> are selectively asserted or deasserted in response to a determination as to whether SIMMs are present in each slot 48, 50, 52 and 54, and as to the type of SIMMs installed—i.e. whether those SIMMs are double sided or single sided. The type/present controller 88 responds to processor 12 writes to certain dedicated addresses within the processor 12 address space by asserting or deasserting the enable signals EN_A<1:0>, EN_B<1:0>, EN_C<1:0>, or EN_D<1:0> corresponding to the addresses written. For example, the type/present controller 88 can operate as follows:

| Processor hexadecimal address | Type/present controller response |
| --- | --- |
| 60 0000 | assert EN_A<1:0> |
| 60 0008 | assert EN_B<1:0> |
| 60 0010 | assert EN_C<1:0> |
| 60 0018 | assert EN_D<1:0> |
| 60 0028 | deassert EN_A<1:0>, EN_B<1:0>, EN_C<1:0>, EN_D<1:0> |
| 60 0058 | deassert EN_A<0> |
| 60 0060 | deassert EN_A<1> |
| 60 0068 | deassert EN_B<0> |
| 60 0070 | deassert EN_B<1> |
| 60 0078 | deassert EN_C<0> |
| 60 0080 | deassert EN_C<1> |
| 60 0088 | deassert EN_D<0> |
| 60 0090 | deassert EN_D<1> |

Enabling or disabling the proper drivers 96 by writing to the type/present controller 88 to assert or deassert the appropriate enable signals EN_A<1:0>, EN_B<1:0>, EN_C<1:0>, and EN_D<1:0> is performed in response to a determination as to whether SIMMs 40 are present in each slot 48, 50, 52 and 54, and as to whether those SIMMs 40 are double sided or single sided.

This determination can be made by system software executed by the processor 12. Accordingly, the system software attempts to access the various channels to determine whether memory is installed there. Referring now to the flow chart of FIG. 7, the basic steps are as follows. The software first attempts to write data to the first side (channels 60 and 64) of the first and second SIMM slots 48 and 50. Accordingly, the memory controller MEM_CTL_1 is enabled by the processor 12(106), and a write is performed to the type/present controller 88 at addresses 60 0000H and 60 0008H (108). The type/present controller 88 asserts, in response, the enable signals EN_A<1:0> and EN_B<1:0>. A 64 bit data pattern is then written to memory address A=2**N. N is initially 0, so the data pattern is written at memory address 0H (110). The software then reads memory address 0H (112).

If the data pattern that was written is not successfully read (114), it is concluded that no SIMMs 40 are plugged into SIMM slots 48 and 50. The processor 12 therefore disables memory controller MEM_CTL1 (116). Furthermore, it is assumed that if single sided SIMMs 40 were plugged into slots 48 and 50, the DRAMs mounted thereon would be accessible at channels 60 and 64; therefore, there is no need to check channels 62 and 66 if the access to channels 60 and 64 has failed. The processor 12 therefore disables memory controller MEM_CTL_2 also (118). A write is then performed to the type/present controller 88 at address locations 60 0058H, 60 0060H, 60 0068H, and 60 0070H (120), thereby deasserting all enable signals EN_A<1:0> and EN_B<1:0>. The outputs of the drivers 96 driving the RAS_A<1:0> RAS_B<1:0>, CAS_A, CAS_B, WE_A, WE_B, MA_A<11:0>, and MA_B<11:0> signals, and thus the signal lines 87 carrying these signals, are thereby placed in a high-impedance state.

If the data pattern that was written at memory address 0 is successfully read (122), it is concluded that SIMMs 40 are present in SIMM slots 48 and 50. A "walking bit" address test is then performed: that is, N is incremented (124), and data patterns are then successively written to and read from memory address 2**N (126, 128), where N is incremented on each successive pass, until the data pattern is not successfully read back (130). The read failure indicates that the address boundary for the DRAMs 46 on the first side 56 of the SIMMs 40 has been reached; thus, the capacity of the first side of the SIMMs 40, and therefore the SIMM type, has been determined. For example, if 1 megabyte SIMMs 40 are plugged into slots 48 and 50, the data pattern will be successfully read back at the memory address of 01 0000, but on the next pass, the data pattern will not be successfully read from the memory address of 10 0000. (Note that care must be taken to prevent a successful read of the data pattern from address location 0 due to address wrap-around—by, for example, ensuring that the data pattern written to each address is unique.)

Once the SIMM type has been determined, the processor 12 enables the memory controller MEM_CTL_2 to attempt to access the second sides (channels 62 and 66) of the SIMMs 40 in slots 48 and 50 (134). The last address location used, where the read from channels 60 and 64 was unsuccessful, is used as the starting address for the memory controller MEM_CTL_2's address space. Thus in the previous example concerning 1 megabyte SIMMs 40, the starting address for testing the second sides of the SIMMs 40 is 10 0000H. The data pattern is written to this address (136), and then a read is performed at the address (138). If the data pattern is successfully read back, it is concluded that double-sided SIMMs 40 are installed in the SIMM slots 48 and 50. The software therefore leaves memory controllers MEM_CTL_1 and MEM_CTL_2 enabled, and leaves enable signals EN_A<1:0> and EN_B<1:0> asserted.

Where JEDEC standard SIMMs 40 are employed, the software can conclude that, if double sided SIMMs 40 are installed in slots 48 and 50, the capacity of the second sides of the SIMMs 40 is the same as the capacity already determined for the first side of the SIMMs 40, and would therefore proceed from step 156. Alternatively, the computer system 10 might support double-sided SIMMs 40 having different capacities on each side. In this case, the software will again write to and read from successive memory addresses until the read fails in order to determine the capacity of the second sides of the SIMMs 40 (steps 142, 144, 146, 148).

If the data pattern initially written to channels 62 and 66 is not successfully read back (150), it is concluded that single-sided SIMMs 40 are installed in the SIMM slots 48 and 50. The memory controller MEM_CTL_2 is therefore disabled (152), and the processor 12 writes to the type/present controller 88 at addresses 60 0060H and 60 0070H to deassert EN_A<1> and EN_B<1> (154). The signal lines 87 carrying the RAS_A<1> and RAS_B<1> signals are thereby placed in a high impedance state.

The software then repeats the same basic process to determine whether SIMMs 40 are installed in slots 52 and 54, and if so, whether they are double-sided. Particularly, the software first attempts to write data to the first side (channels 68 and 72) of the third and fourth SIMM slots 52 and 54. Accordingly, the memory controller MEM_CTL_3 is enabled (156), and a write is performed to the type/present controller 88 at addresses 60 0010H and 60 0018H (158), thus asserting the enable signals EN_C<1:0> and EN_D<1:0>. If SIMMs 40 were installed in the first two slots 48 and 50, a 64 bit data pattern is then written to a memory address immediately following the last addressable location accessible on the first two SIMMs 40 as determined previously (160). If SIMMs 40 were not installed in the first two slots 48 and 50, the software could either start at memory address 0H or at another pre-determined address, depending upon system implementation. The 64 bit data pattern is then read back from the address A to which it was written (161).

If the data pattern that was written is not successfully read (162), it is concluded that no SIMMs 40 are plugged into SIMM slots 52 and 54. Software therefore disables memory controller MEM_CTL_3 (164) within the processor. Furthermore, it is assumed that if single sided SIMMs 40 were plugged into slots 52 and 54, the DRAMs mounted thereon would be accessible at channels 68 and 72; therefore, there is no need to check channels 70 and 74 if the access to channels 68 and 72 has failed. The software therefore disables the memory controller MEM_CTL_4 also (166). A write is then performed to the type/present controller 88 at address locations 60 0078H, 60 0080H, 60 0088H, and 60 0090H (168), thereby deasserting all enable signals EN_C<1:0> and EN_D<1:0>. The outputs of the drivers 96 driving the RAS_C<1:0> RAS_D<1:0>, CAS_C, CAS_D, WE_C, WE_D, MA_C<11:0>, and MA_D<11:0>, and thus the signal lines 87 carrying these signals, are thereby placed in a high impedance state.

If the data pattern that was written at the memory address is successfully read (170), it is concluded that SIMMs 40 are present in SIMM slots 52 and 54. Data patterns are then successively written to and read from successive memory addresses until the data pattern is not successfully read back (steps 172, 174, 176, 178). The read failure indicates that the address boundary for the DRAMs 46 on the first side 56 of the SIMMs 40 has been reached; thus, the capacity of the first side 56 of the SIMMs 40, and therefore the SIMM type, has been determined.

Once the SIMM type has been determined, the software enables the memory controller MEM_CTL_4 (180) to attempt to access the second sides 58 (channels 70 and 74) of the SIMMs 40 in slots 52 and 54. The last address location used, where the read from channels 68 and 72 was unsuccessful, is used as the starting address for the memory controller MEM_CTL_4's address space. The data pattern is written to this address (182), and then a read is performed at the address (184). If the data pattern is successfully read back (186), it is concluded that double-sided SIMMs 40 are installed in the SIMM slots 52 and 54. Software therefore leaves memory controllers MEM_CTL_3 and MEM_CTL_4 enabled, and leaves enable signals EN_A<1:0> and EN_B<1:0> asserted.

The software can again write to and read from successive memory addresses until the read fails in order to determine the capacity of the second sides of the SIMMs 40 (steps 188, 190, 192, 194), or it can assume that the capacity of the second sides is the same as the previously determined capacities for the first sides.

If the data pattern initially written to channels 70 and 74 is not successfully read back (196), it is concluded that single-sided SIMMs 40 are installed in the SIMM slots 52 and 54. The memory controller MEM_CTL_4 is therefore disabled (198), and the processor 12 writes to the type/present controller 88 at address locations 60 0080H and 60 0090H to deassert EN_C<1> and EN_D<1> (200). The signal lines 87 carrying the RAS_C<1> and RAS_D<1> signals are thereby placed in the high impedance state.

Figure 8:
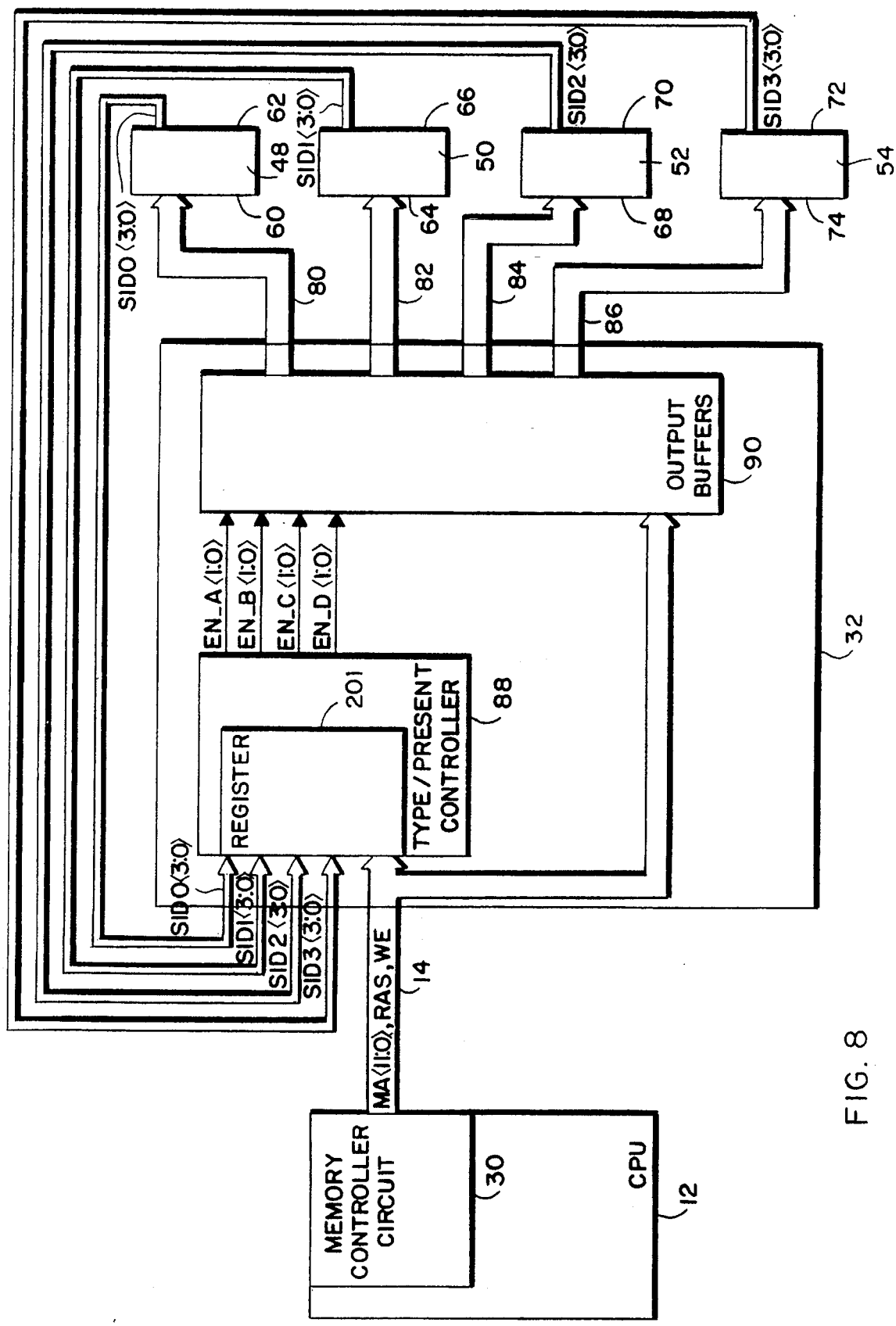
FIG. 8 is a block diagram of an alternate embodiment of the buffer expansion array of FIG. 5.

A second embodiment, as shown in FIG. 8, makes use of the SIMM ID bits which are provided on JEDEC industry standard SIMMs 40. These SIMM ID bits indicate whether SIMMs 40 are installed and, if so, the types of the SIMMs 40 installed. Accordingly, the SIMM ID bits are fed from the SIMMs 40 to a register 201 within the type/present controller 88. One set of SIMM ID bits is input to the register 201 for each SIMM; thus, SID0<3:0> corresponds to SIMM slot 48; SID1<3:0> corresponds to SIMM slot 50, SID2<3:0> corresponds to SIMM slot 52; and SID3<3:0> corresponds to SIMM slot 54. The industry standard encoding of the SIMM ID bits is as follows:

TABLE I

| SIMM Type | Speed | SID0 | SID1 | SID2 | SID3 |
|---|---|---|---|---|---|
| 1MB (256K × 36) | 100 ns | 1 | 0 | 1 | 1 |
| | 80 ns | 1 | 0 | 0 | 1 |
| | 70 ns | 1 | 0 | 1 | 0 |
| | 60 ns | 1 | 0 | 0 | 0 |
| 2MB (512K × 36) | 100 ns | 0 | 1 | 1 | 1 |
| | 80 ns | 0 | 1 | 0 | 1 |
| | 70 ns | 0 | 1 | 1 | 0 |
| | 60 ns | 0 | 1 | 0 | 0 |
| 4MB (1M × 36) | 100 ns | 1 | 1 | 1 | 1 |
| | 80 ns | 1 | 1 | 0 | 1 |
| | 70 ns | 1 | 1 | 1 | 0 |
| | 60 ns | 1 | 1 | 0 | 0 |
| 8MB (2M × 36) | 100 ns | 0 | 0 | 1 | 1 |
| | 80 ns | 0 | 0 | 0 | 1 |
| | 70 ns | 0 | 0 | 1 | 0 |
| | 60 ns | 0 | 0 | 0 | 0 |
| 16MB (4M × 36) | 100 ns | 1 | 0 | 1 | 1 |
| | 80 ns | 1 | 0 | 0 | 1 |
| | 70 ns | 1 | 0 | 1 | 0 |
| | 60 ns | 1 | 0 | 0 | 0 |
| 32MB (8M × 36) | 100 ns | 0 | 1 | 1 | 1 |
| | 80 ns | 0 | 1 | 0 | 1 |
| | 70 ns | 0 | 1 | 1 | 0 |
| | 60 ns | 0 | 1 | 0 | 0 |
| EMPTY SLOT | | 0 | 0 | 0 | 0 |

The processor 12 can therefore determine the presence or absence of SIMMs 40 in the slots 48, 50, 52, and 54, for certain cases, simply by reading the register 201 via the processor data bus 16. With the exception of the 8 Mbyte 60 ns case, every type of SIMM 40 ties at least one the SIMM ID bits to a logic '1' level; thus, when all the SIMM ID bits corresponding to a given slot are at a logic level '0', there is no SIMM 40 installed in the slot. Thus, for computer systems 10 employing a subset of the SIMM types listed above which does not include the 8 Mbyte 60 ns type, the processor 12 can read the SIMM ID bits for each slot from the register 201 to determine which of the enable bits should be asserted, and which of the memory controllers should be enabled.

For example, if either of the sets of SIMM ID bits SID0<3:0> or SID1<3:0> are all at a logic '0' level, then there is no SIMM installed in one of the slots 48 or 50. In this case, the processor 12 disables the memory controllers MEM_CTL_1 and MEM_CTL_2, thus disabling the memory controller state machines. The processor 12 then writes to the type/present controller 88 at the appropriate addresses as previously described to deassert the enable signals EN_A<1:0> and EN_B<1:0>, thereby placing the corresponding signal lines 87 carrying the buffered memory address and control signals 80 and 82 to the slots 48 and 50 in the high impedance state.

If, on the other hand, the sets of SIMM ID bits SID0<3:0> and SID1<3:1> decode to 1 MB, 4 MB, or 16 MB SIMMs 40, the decode indicates that single-sided SIMMs 40 are present in the slots 48 and 50. The processor therefore disables the memory controller MEM_CTL_2, and then writes to the type/present controller 88 to deassert the enable bits EN_A<1> and EN_B<1>, thereby disabling the drivers 96 driving the RAS_A<1> and RAS_B<1> signals to the slots 48 and 50 and placing the corresponding signal lines 87 in the high impedance state.

If, however, the sets of SIMM ID bits SID0<3:0> and SID1<3:1> decode to 2 MB or 32 MB SIMMs 40, then double-sided SIMMs 40 are present in the slots 48 and 50. The processor 12 therefore leaves the memory controllers MEM_CTL_1 and MEM_CTL_2 enabled, and leaves the enable signals EN_A<1:0> and EN_B<1:0> asserted via the type/present controller 88.

If one of the sets of SIMM ID bits—for example, SID0<3:0>—decodes to indicate a single-sided SIMM is plugged into the slot 48, and the other set of SIMM ID bits SID1<3:0> decode to indicate that a double-sided SIMM 40 is plugged into the slot 50, the processor 12 enables only the memory controller MEM_CTL_1 and the enable signals EN_A<0> and EN_B<0> are asserted via the type/present controller 88; thus, the second side of the double-sided SIMM 40 is ignored.

The remaining two slots 52 and 54 are decoded in exactly the same manner. If either of the sets of SIMM ID bits SID2<3:0> or SID3<3:0> are all at a logic '0' level, then there is no SIMM 40 installed in one of the slots 52 or 54; therefore, the processor 12 disables the memory controllers MEM_CTL_3 and MEM_CTL_4, and enable signals EN_C<1:0> and EN_D<1:0> are deasserted via the type/present controller 88. The memory controller MEM_CTL_3 and MEM_CTL_4 state machines are thus disabled and the output drivers associated with the signals routed to the slots 52 and 54 are disabled.

If, on the other hand, the sets of SIMM ID bits SID2<3:0> and SID3<3:1> decode to 1 MB, 4 MB, or 16 MB SIMMs 40, the decode indicates that single-sided SIMMs 40 are present in the slots 48 and 50. The processor 12 therefore disables the memory controller MEM_CTL_4, and the enable bits EN_C<1> and EN_D<1> are deasserted via the type/present controller 88, thereby disabling the drivers 96 driving the RAS_C<1> and RAS_D<1> signals to the slots 52 and 54 and placing the corresponding signal lines 87 in the high impedence state.

If, however, the sets of SIMM ID bits SID2<3:0> and SID3<3:1> decode to 2 MB or 32 MB SIMMs 40, then double-sided SIMMs 40 are present in the slots 52 and 54. The memory controllers MEM_CTL_3 and MEM_CTL_4 are therefore enabled by the processor 12, and the enable signals EN_C<1:0> and EN_D<1:0> are asserted via the type/present controller 88.

Note, however, that only four SIMM ID bits are provided to cover 24 possible SIMM types in TABLE I; thus, some of the decodes must overlap. For example, the decode indicating a 1 MB 100 ns SIMM is the same as the decode indicating a 16 MB 100 ns SIMM. However, the capacity of a given SIMM must be known in order to determine at which address boundaries the memory controllers MEM_CTL_1, MEM_CTL_2, MEM_CTL_3, and MEM_CTL_4 should be enabled. Thus, software executing on the processor 12 performs the "walking bit" address test previously described on the installed pairs of SIMMs 40 in order to make this determination.

Finally, if 8 MB SIMMs 40 are supported by the computer system 10, then if any of the SID0<3:0>, SID1<3:0>, SID2<3:0>, or SID3<3:0> decode to "0 0 0 0", software executing on the processor 12 can be used as previously described to check to see if any memory is actually present in the corresponding slot. For example, if the SID0<3:0> bits decode to "0 0 0 0", and if the software cannot successfully read a data pattern that was written to a memory address corresponding to slots 48 and 50, then it is concluded that no SIMMs 40 are present in the slots 48 and 50. The memory controller MEM_CTL_1 corresponding to slots 48 and 50 is therefore disabled, and the enable bits EN_A<1:0> and EN_B<1:0> are deasserted.

Figure 9:
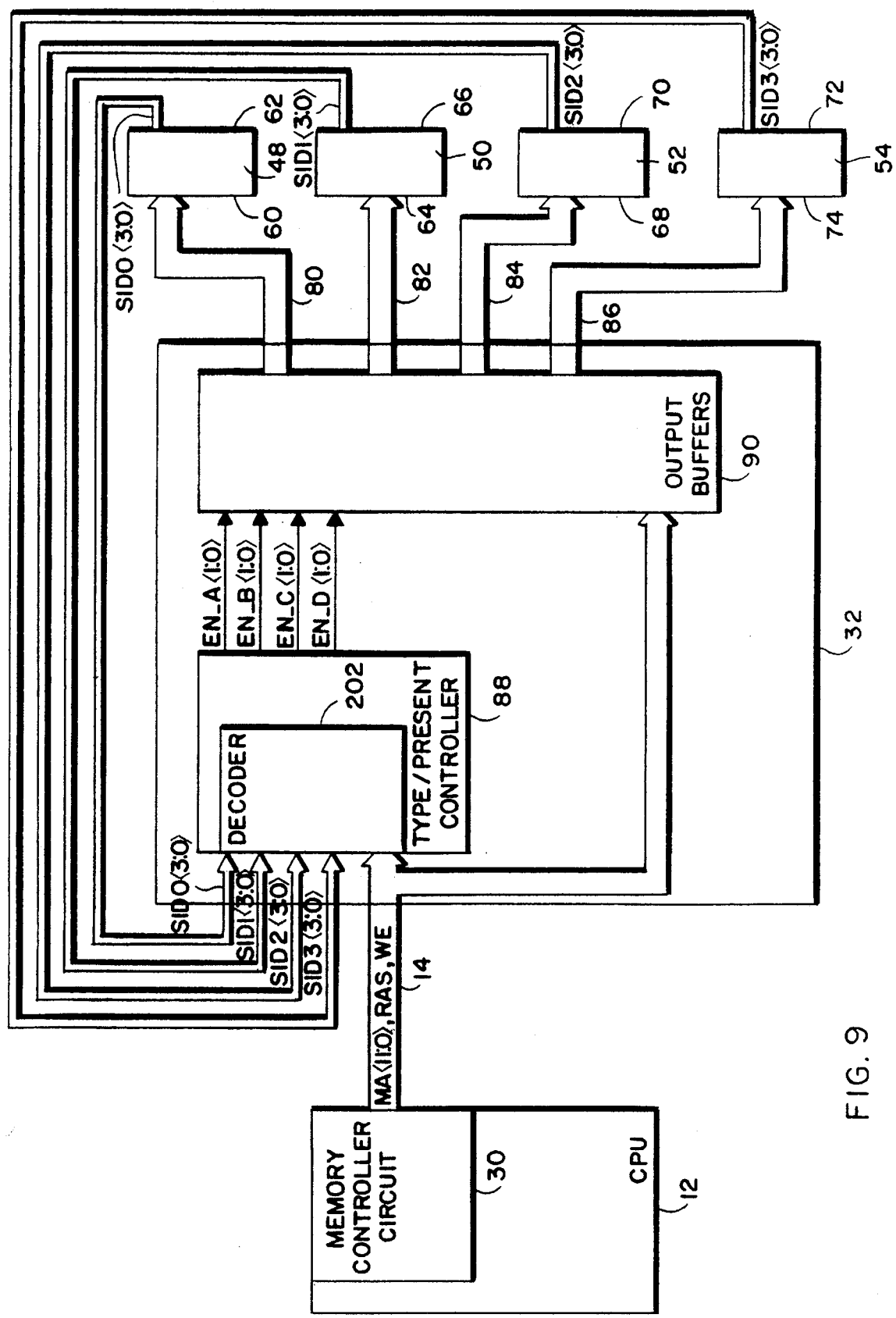
FIG. 9 is a block diagram of an alternate implementation of the buffer expansion array of FIG. 8.

An alternate embodiment that makes use of the SIMM ID bits is shown in FIG. 9. Accordingly, the sets of SIMM ID bits SID0<3:0>, SID1<3:0>, SID2<3:0>, and SID3<3:0> are fed from the SIMMs 40 to a decoder 202 within the type/present controller 88. The presence or absence of SIMMs 40 in the slots 48, 50, 52, and 54, and the type of the SIMMs 40 present, can therefore be determined, for certain cases, by a hardware decode of the SIMM ID bits. Thus, for computer systems 10 employing a subset of the SIMM types listed above which does not include the 8 Mbyte 60 ns type, the decoder 202 provides a direct hardware decode of the SIMM ID bits for each slot, and asserts or deasserts the appropriate enable bits EN_A<1:0>, EN_B<1:0>, EN_C<1:0>, and EN_D<1:0> in response to the decode.

For example, if either of the sets of SIMM ID bits SID0<3:0> or SID1<3:0> are all at a logic '0' level, then there is no SIMM 40 installed in one of the slots 48 or 50. In this case, the decoder 202 deasserts the enable signals EN_A<1:0> and EN_B<1:0>, thereby disabling the drivers 96 associated with the signals routed to the slots 48 and 50.

If, on the other hand, the sets of SIMM ID bits SID0<3:0> and SID1<3:1> decode to 1 MB, 4 MB, or 16 MB SIMMs 40, the decode indicates that single-sided SIMMs 40 are present in the slots 48 and 50. The decoder 202 therefore deasserts the enable bits EN_A<1> and EN_B<1>, thereby disabling the drivers 96 driving the RAS_A<1> and RAS_B<1> signals to the slots 48 and 50 and placing the corresponding signal lines 87 in the high impedence state.

If, however, the sets of SIMM ID bits SID0<3:0> and SID1<3:1> decode to 2 MB or 32 MB SIMMs 40, then double-sided SIMMs 40 are present in the slots 48 and 50. The decoder 202 therefore asserts the signals EN_A<1:0> and EN_B<1:0>. The remaining two slots 52 and 54 are decoded in exactly the same manner.

The previously described software methods can be used in combination with the decoder 202 in order to support the 8 MB 60 ns SIMMs or to determine the capacity of installed SIMMS for enabling or disabling the memory controllers.

The implementations so far described enable or disable the entire memory address bus MA<11:0> to be driven to a SIMM slot in which a SIMM is installed. However, all the memory address bits are not required for all the possible SIMM types. 16 MB single-sided and 32 MB double-sided SIMMs 40 require all 12 address bits; however, the 4 MB single sided and 8 MB double-sided SIMMs 40 require only MA<10:0> to fully address the memory available on the SIMM. The 1 MB and 2 MB SIMMs 40 require only the MA<9:0> address bits. Since the previously described software determines the capacity of the installed SIMMs 40, the memory address bits MA_A<11:10>, MA_B<11:10>, MA_C<11:10>, and MA_D<11:10> can be selectively enabled or disabled for each channel just as the RAS_A<1:0>, RAS_B<1:0>, RAS_C<1:0>, and RAS_D<1:0> are.

Figure 10:
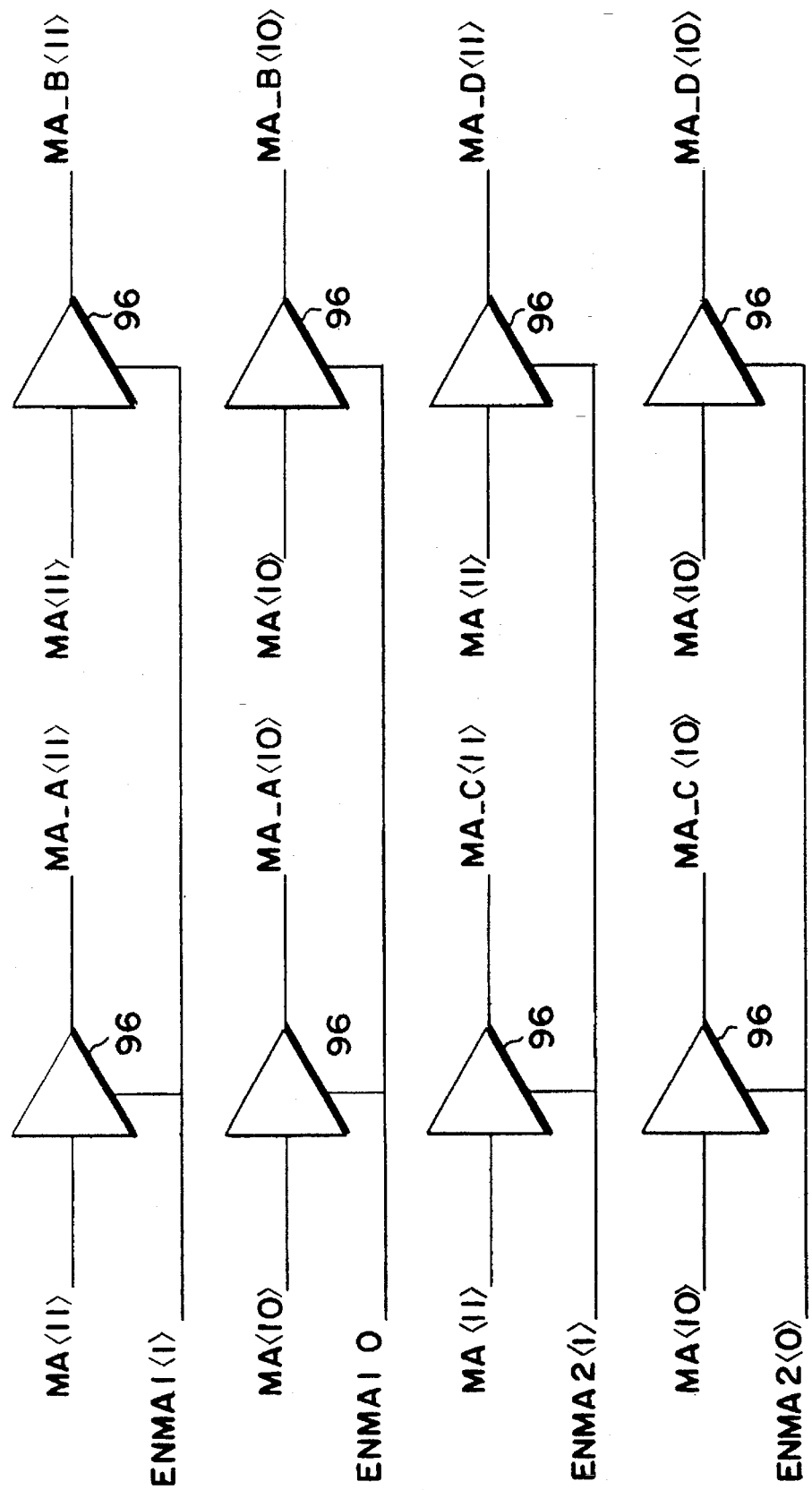
FIG. 10 is a schematic representation of additional drivers within the output buffers of FIG. 5.

Referring to FIG. 10, there is shown an implementation of the output buffers 90 wherein MA_A<11:10>, MA_B<11:10>, MA_C<11:10>, and MA_D<11:10> drivers 96 are separately enabled by the memory controller enable signals ENMA1<1:0> and ENMA2<1:0>. The ENMA1<1:0> signals are coupled to the drivers 96 driving MA_A<11:10> and MA_B<11:10> respectively, such that when ENMA1<1> is deasserted the signal lines carrying the MA_A<11> and MA_B<11> signals are in the high impedence state, and when ENMA1<0> is deasserted the signal lines 87 carrying the MA_A<10> and MA_B<10> signals are in the high impedance state. The ENMA2<1:0> signals are coupled to the drivers 96 driving MA_A<11:10> and MA_B<11:10> respectively in the same manner. These enable signals can be asserted and deasserted in a manner similar to the previously describe enable signals, at their own dedicated address spaces. For example:

| Processor hexadecimal address | Type/present controller Response |
| --- | --- |
| 60 0200 | assert ENMA1<1:0>, ENMA2<1:0> |
| 60 0208 | deassert ENMA1<1> |
| 60 0210 | deassert ENMA1<0> |
| 60 0218 | deassert ENMA2<1> |
| 60 0220 | deassert ENMA2<0> |

Figure 11:
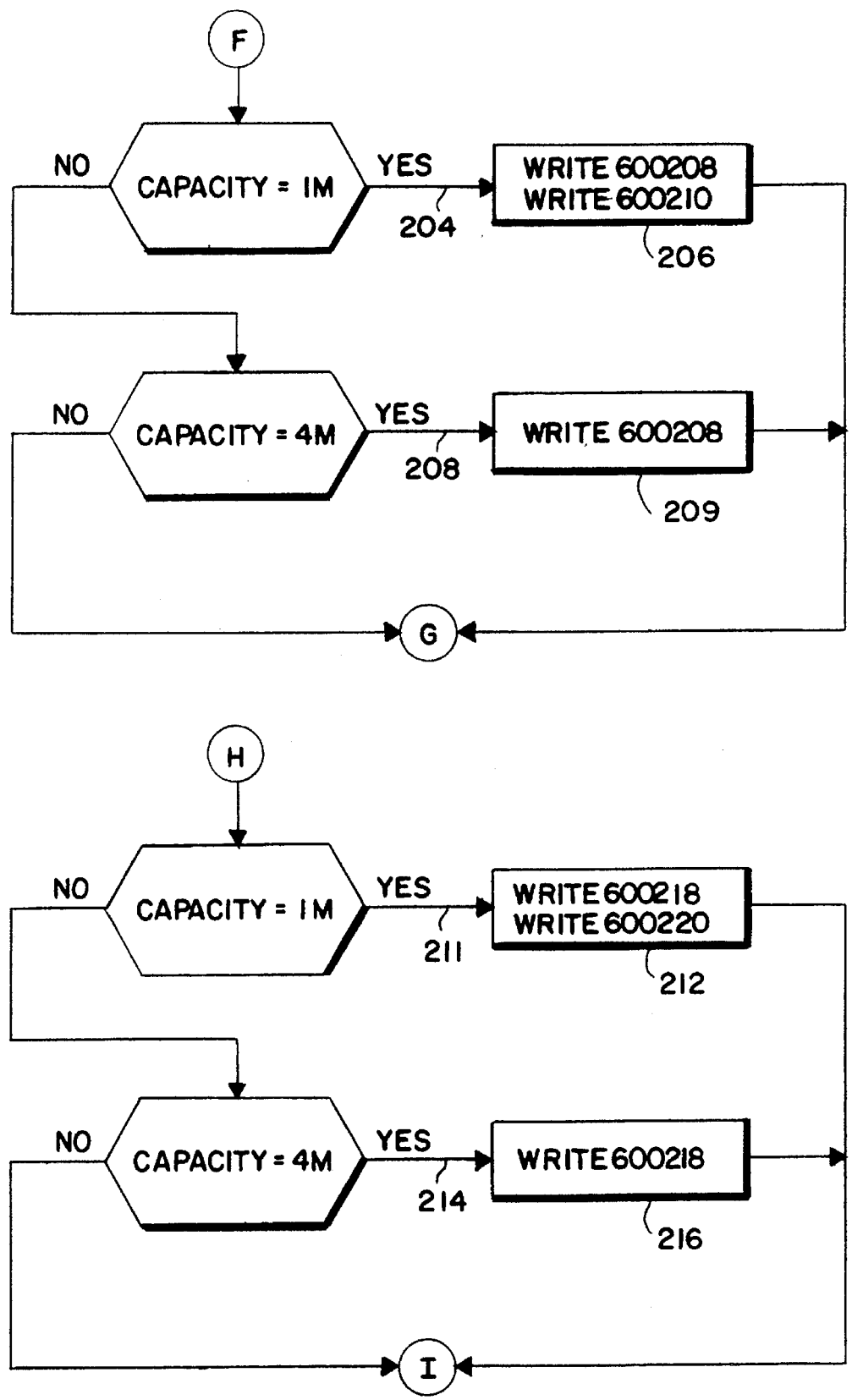
FIG. 11 is a flow diagram of operation, additional to the operation represented in FIG. 7.

The flow diagram of FIG. 11 adds to the flow diagram of FIG. 7 such that at each point where the capacity of a given installed SIMM is determined, this information is used to write to the appropriate address to assert or deassert the memory controller enable signals. For example, the ENMA1<1:0> and ENMA2<1:0> enable signals are initially asserted by writing to 60 0200H. If it is determined that no SIMM is installed in the slot 48 (FIG. 7), then a write is performed to the type/present controller at addresses 60 0208H and 60 0210H to deassert the enable signals ENMA1<1:0> in addition to all the other enable signals constituting buffered memory address signals 80 and 82. If it is determined that a 1 MB SIMM is installed in slot 48 (204), a write is performed to the type/present controller at addresses 60 0208H and 60 0210H to deassert the enable signals ENMA1<1:0>, thus placing the signal lines 87 carrying the unused memory address signals MA_A<11:10> and MA_B<11:10> to the SIMM slots 48 and 50 in the high impedance state (206). On the other hand, if it is determined that a 4 MB SIMM is installed in the slot 48 (208), then a write is performed to the type/present controller at the address 60 0208H to deassert the ENMA1<1> signal, thereby placing the signal lines 87 carrying the unused memory address signals MA_A<11> and MA_B<11> in the high impedance state (210).

Similarly, if it is determined that no SIMM is installed in the slot 52 (FIG. 7), then a write is performed to the type/present controller at addresses 60 0208H and 60 0210H to deassert the enable signals ENMA2<1:0> in addition to all the other enable signals constituting buffered memory address signals 84 and 86. If it is determined that a 1 MB SIMM is installed in slot 52 (210), a write is performed to the type/present controller at addresses 60 0218H and 60 0220H to deassert the enable signals ENMA2<1:0>, thus placing the signal lines 87 carrying the unused memory address signals MA_C<11:10> and MA_D<11:10> routed to the SIMM slots 52 and 54 in the high impedance state (212). On the other hand, if it is determined that a 4 MB SIMM is installed in the slot 52 (214), then a write is performed to the type/present controller at the address 60 0218H to deassert the ENMA2<1> signal, thereby placing the signal lines carrying the unused memory address signals MA_C<11> and MA_D<11> in the high impedance state (216).

Figure 12:
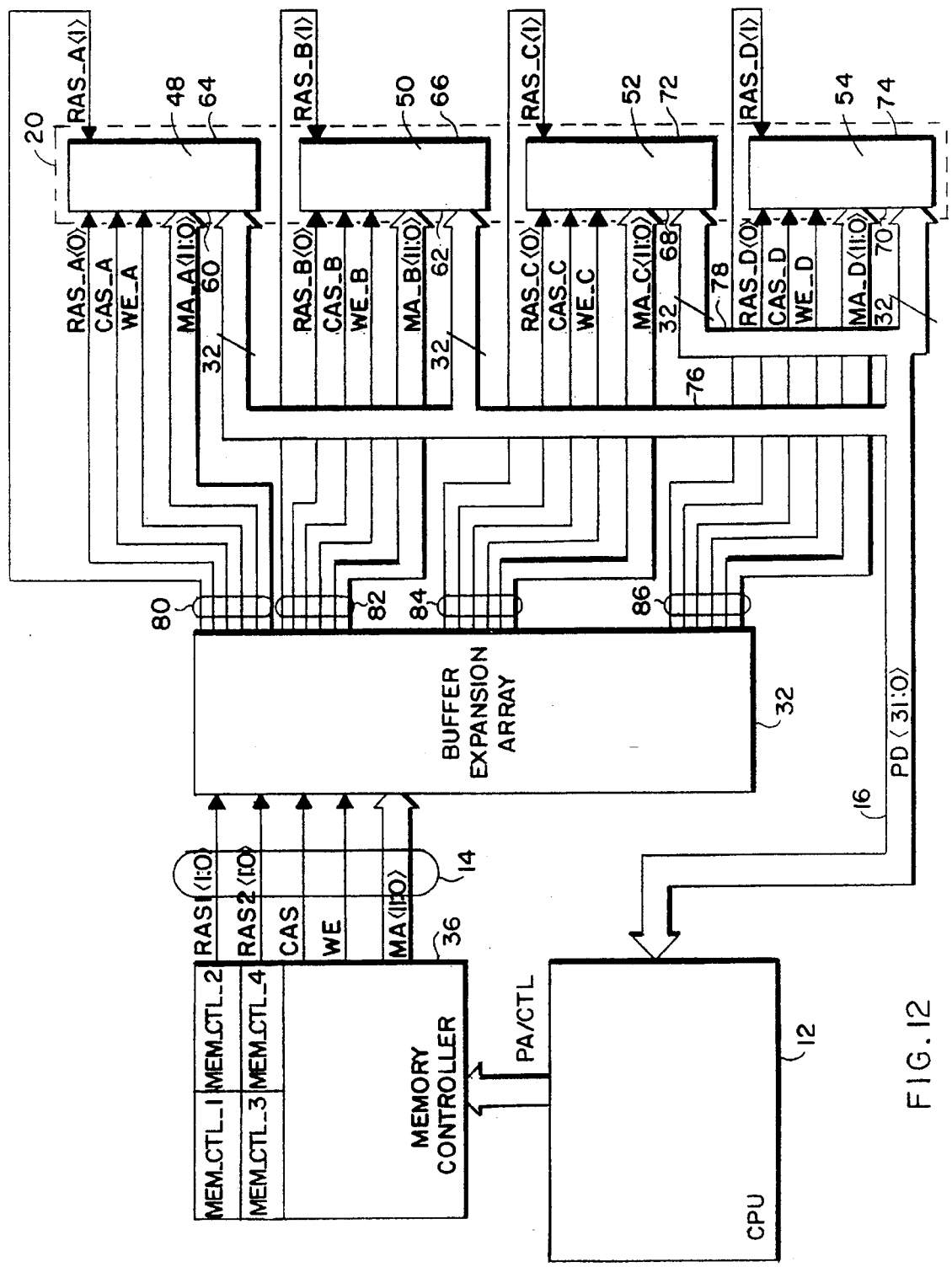
FIG. 12 is a block diagram of the CPU, buffer expansion array, memory controller circuit, and system memory of FIG. 2.

The previously described principles are equally applicable in conventional computer systems implementing 32 bit data busses, such as the computer system shown in FIG. 2. Referring now to FIG. 12, there is shown such a computer system 10 in which a processor 12 is coupled to an external memory controller circuit 36, which is in turn coupled to the buffer expansion array 32. However, since the processor 12 is coupled to a 32 bit processor data bus 16, 32 bit SIMM slots 48, 50, 52, and 54 need not be accessed in pairs. Instead, each channel can separately provide memory data to the processor data bus 16. Thus, channel 60 is associated with a first side 56 of the slot 48, while channel 64 is associated with the second side 58 of the slot 48. Channels 62 and 66 are likewise associated with slot 50; channels 68 and 72 with slot 52; and channels 70 and 74 with slot 54. It is conceivable to provide separate memory controllers for each channel; however, the memory controller circuit 30 as shown includes four separate memory controllers MEM_CTL_1, MEM_CTL_2, MEM_CTL_3, and MEM_CTL_4 each of which is a separate state machine that can be separately enabled and disabled. Each memory controller provides memory address and control signals for one of the slots 48, 50, 52, and 54.

Figure 13:
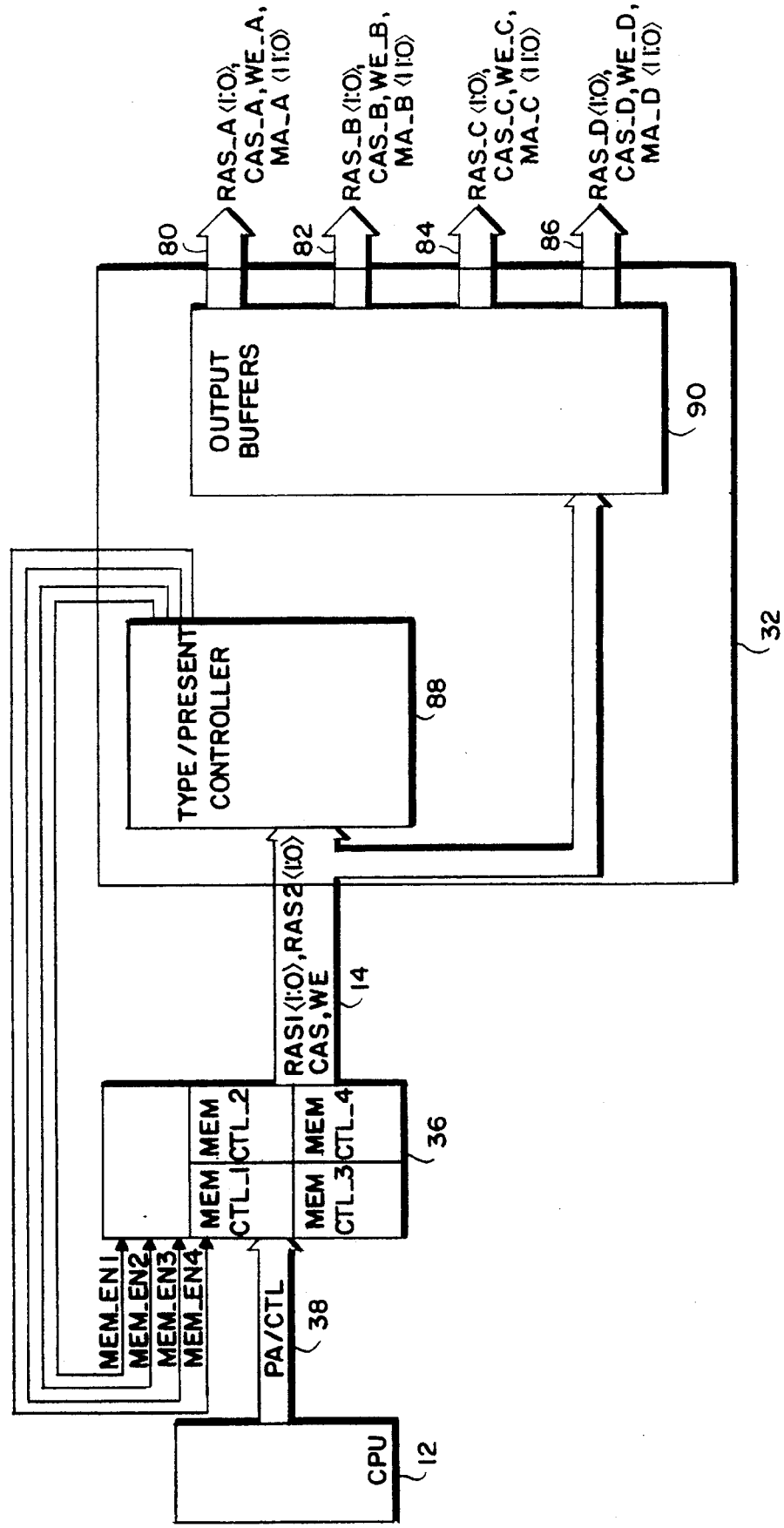
FIG. 13 is a block diagram of the buffer expansion array of FIG. 12.

The buffer expansion array 32, shown in more detail in FIG. 13, includes the type/present controller 88 and the drivers 96 for driving the buffered memory address and control signals 80, 82, 84, and 86 to the slots 48, 50, 52, and 54 respectively as previously described. The type/present controller 88 shown here also provides as output the signals MEM_EN1, MEM_EN2, MEM_EN3, and MEM_EN4, which, when asserted, enable the memory controllers MEM_CTL_1, MEM_CTL_2, MEM_CTL_3, and MEM_CTL_4 respectively. The MEM_EN1, MEM_EN2, MEM_EN3, and MEM_EN4 signals can be asserted and deasserted in a manner similar to that previously described for asserting and deasserting the EN_A<1:0>, EN_B<1:0>, EN_C<1:0>, an EN_D<1:0> signals. For example, the type/present controller 88 can respond to writes by the processor 12 via the processor address and control bus 38 as follows:

| Processor hexadecimal address | Type/present controller | Response |
|---|---|---|
| 60 0100 | assert | MEM_EN1, MEM_EN2, MEM_EN3, MEM_EN4 |
| 60 0108 | deassert | MEM_EN1 |
| 60 0110 | deassert | MEM_EN2 |
| 60 0118 | deassert | MEM_EN3 |
| 60 0120 | deassert | MEM_EN4 |

Figure 14:
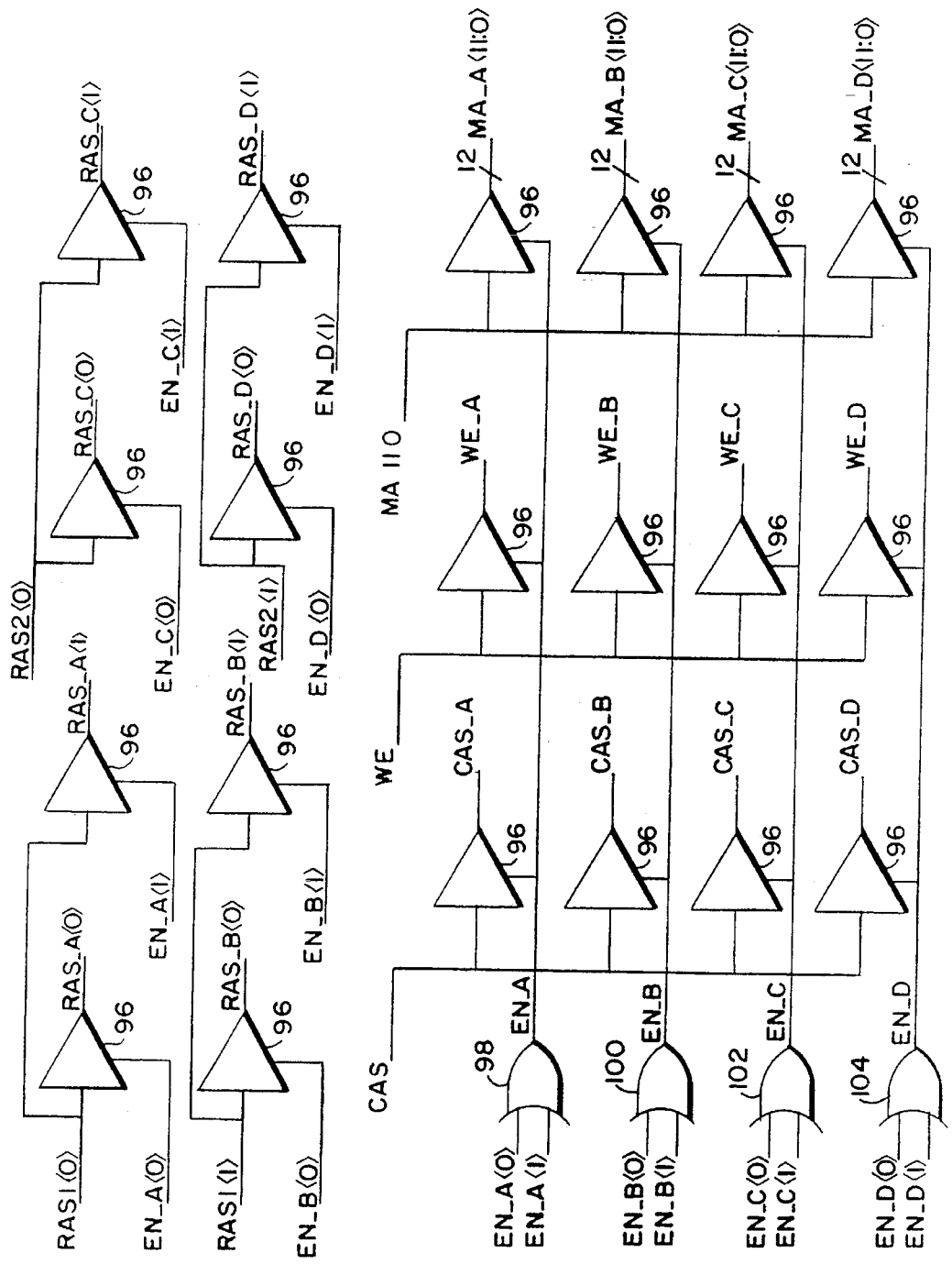
FIG. 14 is a schematic representation of the output buffers of FIG. 13.

The output buffers 90 are shown in further detail in FIG. 14. Contained within the output buffers 90 are drivers 96, each separately enabled by one of the enable signals EN_A<1:0>, EN_B<1:0>, EN_C<1:0>, or EN_D<1:0>. Thus, when the memory control signal RAS1<0> is asserted by the memory controller MEM_CTL_1 and the enable signal EN_A<0> is asserted, the RAS1<0> signal is asserted onto the signals RAS_A<0> for the channel 60. But, when the enable signal EN_A<0> is deasserted, the signal line 87 carrying the RAS_A<0> signal is placed in the high impedance state.

Likewise, when the memory control signal RAS1<0> is asserted by the memory controller MEM_CTL_1 and the enable signal EN_A<1> is asserted, the RAS1<0> signal is asserted onto the signal RAS_A<1> for the channel 62. When the RAS1<1> signal is asserted by the second memory controller MEM_CTL_2, and the enable signal EN_B<0> is asserted, the RAS1<1> signal is asserted onto the signal RAS_B<0> for the channel 64. When the memory control signal RAS1<1> is asserted by the memory controller MEM_CTL_1 and the enable signal EN_B<1> is asserted, the RAS1<1> signal is asserted onto the signal RAS_B<1> for the channel 66. When the RAS2<0> signal is asserted by the third memory controller MEM_CTL_3, and the enable signal EN_C<0> is asserted, the RAS2<0> signal is driven onto the RAS_C<0> signal to the channel 68. When the RAS2<0> signal is asserted by the memory controller MEM_CTL_3, and the enable signal EN_C<1> is asserted, the RAS2<0> signal is driven onto the RAS_C<1> signal to the channel 70. Finally, when the RAS2<1> signal is asserted by the fourth memory controller MEM_CTL_4, and the enable signal EN_C<1> is asserted, the RAS2<1> signal is driven onto the RAS_D<0> signal to the channel 72. Likewise, when the RAS2<1> signal is asserted by the memory controller MEM_CTL_4, and the enable signal EN_D<1> is asserted, the RAS2<1> signal is driven onto the RAS_D<1> signal to the channel 74.

According to the implementation shown in FIG. 14, the remaining address and control signals in each of the four sets of buffered memory address and control signals 80, 82, 84, and 86 are driven to both channels of each slot. 'OR' gates 98, 100, 102, and 104 therefore logically 'OR' together the enable signals corresponding to the two channels of each slot to provide enable signals EN_A, EN_B, EN_C and EN_D. These enable signals enable corresponding drivers 96 to drive the remaining buffered memory address and control signals 80, 82, 84, and 86 respectively. Accordingly, the CAS signal is driven by a driver 96 onto the CAS_A signal to slot 48 and thus to channels 60 and 62 if either EN_A<0> or EN_A<1> is asserted. Likewise, the WE_A and MA_A<11:0> signals are driven if either EN_A<0> or EN_A<1> is asserted. As can be seen, the buffered address and control signals to the remaining slots 50, 52, and 54 are generated in the same manner from the corresponding enable signals EN_B, EN_C, and EN_D.

The buffer expansion array 32 operates generally as previously described except that each channel is accessed separately to determine whether memory is installed there. Referring now to the flow chart of FIG. 15a–15b, the basic steps taken by software executing on the processor 12 in order to determine whether a SIMM 40 is installed in a given slot and, if so, whether DRAMs 46 are present on both sides of the SIMM 40, are as follows. The software first enables the memory controller MEM_CTL_1 and the enable signal EN_A<0> and attempts to write data to the first side— channel 60—of the first SIMM slot 48. Accordingly, a write is performed to the type/present controller 88 at address location 60 0100H to assert the MEM_EN1 signal and thereby enable the memory controller MEM_CTL_1 (218). Next, a write is performed to the type/present controller 88 at address location 60 0000H, thereby asserting the enable signals EN_A<1:0>. Then a write is performed to the type/present controller 88 at address location 60 0060 to deassert the enable signal EN_A<1> (220). A 32 bit data pattern is then written to memory address 0H (222). The software then reads memory address 0H (224).

If the data pattern that was written is not successfully read (226), it is concluded that no SIMM is plugged into the SIMM slot 48. Software therefore writes to the type/present controller 88 at address location 60 0108H to deassert MEM_EN1, thereby disabling the memory controller MEM_CTL1 (227). Furthermore, it is assumed that if a single sided SIMM were plugged into the slot 48, the DRAMs mounted thereon would be accessible at channel 60; therefore, there is no need to check channel 64 if the access to channel 60 has failed. A write is then performed to the type/present controller 88 at address location 60 0058H, thereby deasserting the enable signal EN_A<1> (228). The signal lines 87 carrying the RAS_A<1:0>, CAS_A, WE_A, and MA_A<11:0> signals are thereby placed in a high impedance state.

If the data pattern that was written at memory address 0 is successfully read (229), it is concluded that a SIMM is present in SIMM slot 48. Data patterns are then successively written to and read from memory address 2N, where N is incremented on each successive pass, until the data pattern is not successfully read back (steps 230, 232, 234, 236). The read failure indicates that the address boundary for the DRAMs 46 on the first side of the SIMM 40 has been reached; thus, the capacity of the first side of the SIMM 40, and therefore the SIMM type, has been determined. For example, if a 1 megabyte SIMM 40 is plugged into the slot 48**, the data pattern will be successfully read back at the memory address of 01 0000, but on the next pass, the data pattern will not be successfully read from the memory address of 10 0000.

Once the SIMM type has been determined, the software, still using the memory controller MEM_CTL_1, attempts to access the second side—channels 64—of the SIMM in slot 48. The software writes to the type/present controller 88 at address location 60 0000 to re-assert the enable signal EN_A<1> (238). The last memory address location used, where the read from channel 60 was unsuccessful, is used as the starting address for accessing channel 64. Thus in the previous example concerning a 1 megabyte SIMM, the starting address for testing the second side of the SIMM is 10 0000H. The data pattern is written to this address (240), and then a read is performed at the address (242). If the data pattern is successfully read back (244), it is concluded that a double-sided SIMM 40 is installed in the SIMM slot 48. Software therefore leaves the memory controller MEM_CTL_1 enabled, and leaves enable signals EN_A<1:0> asserted.

The software can again write to and read from successive memory addresses until the read fails in order to determine the capacity of the second side of the SIMM, or it can assume that the capacity of the second side is the same as the previously determined capacity for the first side (steps 246, 248 250, 252).

If the data pattern initially written to channel 64 is not successfully read back (254), it is concluded that a single-sided SIMM is installed in the SIMM slot 48. Software therefore writes to the type/present controller 88 at address location 60 0080H to deassert EN_A<1> (256). The signal line 87 driving the RAS_A<1> signal is thereby placed in a high impedance state.

The remaining three SIMM slots 50, 52, and 54 are tested in exactly the same manner, as shown in FIGS. 14(c)–14(h). If a SIMM was found in the slot 48, then testing of the slot 50 will begin at the next successive address. If no SIMM was found in the slot 48, then testing of the next SIMM slot 50 can start from memory address 0 or from an address pre-determined for that slot. Each memory controller MEM_CTL_2, MEM_CTL_3, and MEM_CTL_4 is enabled in succession to test the corresponding SIMM slots 50, 52, and 54 respectively, and is disabled in the event that no SIMM is found in the slot.

Note that, where SIMM ID decodes overlap—for instance, for the 1 MB and 16 MB cases—software can be used to determine the proper SIMM type as previously described. The memory controllers, then, should be initially configured to access the higher capacity SIMM type. For example, the memory controller MEM_CTL_1 should be configured to access a memory address range between 0 and 32 Mbytes until the type of a SIMM plugged into the slot 48 is determined. Then, in the event that a lower capacity SIMM type is determined—1 MB, for example, the memory controller MEM_CTL_1 can be configured to access the first megabyte of memory space while the memory controller MEM_CTL_2 is configured to access a 32 MB address space starting from the second megabyte. The process is then repeated for the memory controller MEM_CTL_2 and successive memory controllers MEM_CTL_3 and MEM_CTL_4 as shown in FIGS. 15c–15h.

Figure 16:
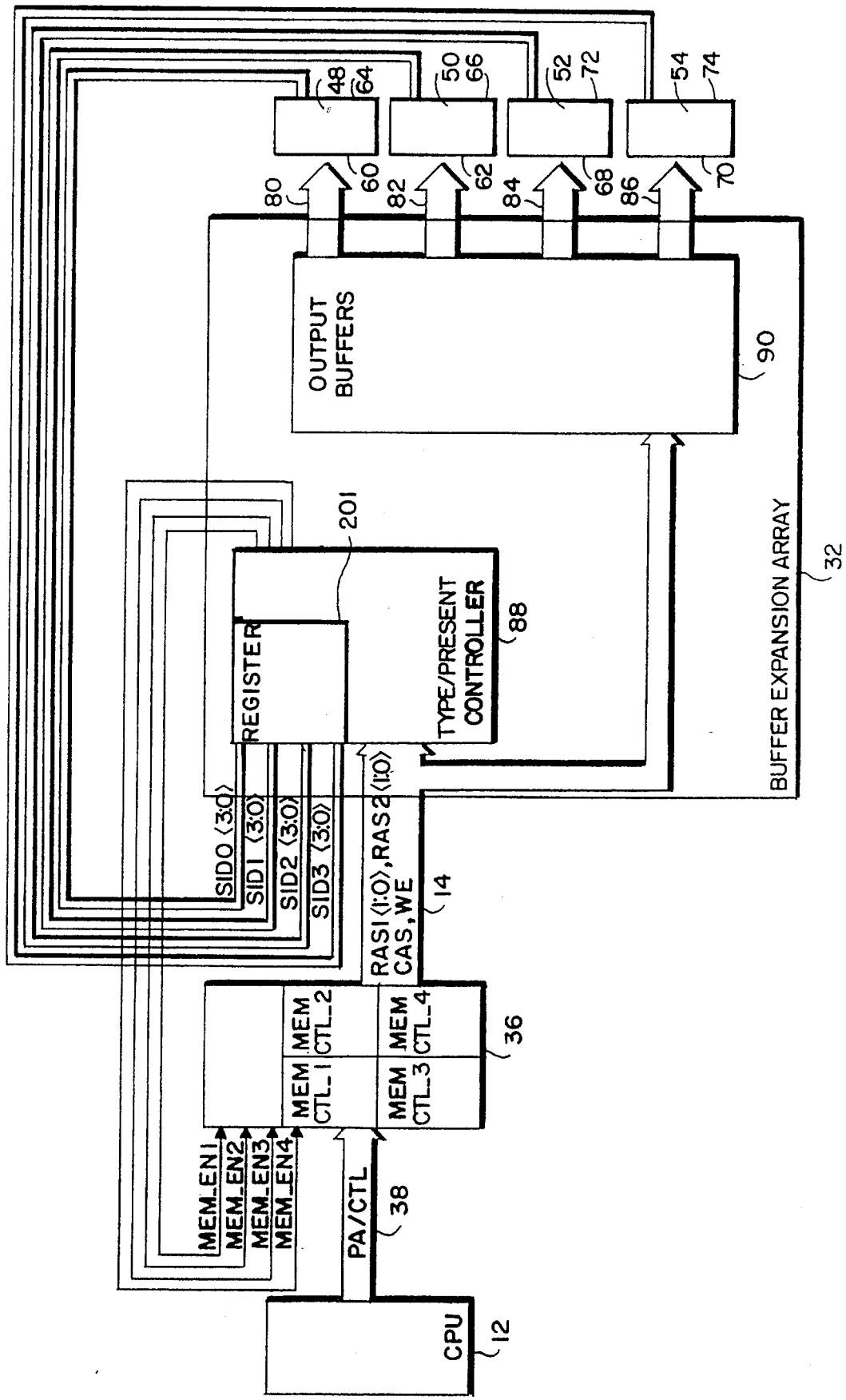
FIG. 16 is a is a block diagram of an alternate embodiment of the buffer expansion array of FIG. 12.

Alternatively, the type/present controller 88 can use the SIMM ID bits which are provided on JEDEC industry standard SIMMs 40 for determining if SIMMs 40 are installed in the slots 48, 50, 52, and 54. Referring now to FIG. 16, there is shown another embodiment of the buffer expansion array wherein SIMM ID bits are fed from the SIMMs 40 to a register 201 within the type/present controller 88. Again, one set of SIMM ID bits is input to the register 201 for each SIMM; thus, SID<3:0> corresponds to SIMM slot 48; SID2<3:0> corresponds to SIMM slot 50, SID3<3:0> corresponds to SIMM slot 52; and SID3<3:0> corresponds to SIMM slot 54.

The processor 12 can therefore determine the presence or absence of SIMMs 40 in the slots 48, 50, 52, and 54, and whether the present SIMMs 40 are double or single sided, by simply reading the register 201. The processor 12 can then program the type/present controller 88 to assert or deassert the appropriate driver enable signals EN_A<1:0>, EN_B<1:0>, EN_C<1:0>, and EN_D<1:0> to the drivers 96, and to assert or deassert the appropriate memory controller enable signals MEM_EN_1, MEM_EN_2, MEM_EN_3, and MEM_EN_4 to enable or disable the corresponding memory controllers MEM_CTL_1, MEM_CTL_2, MEM_CTL_3, and MEM_CTL_4.

For example, if the processor 12 reads the register 201 and finds that the set of SIMM ID bits SID0<3:0> are all at a logic '0' level, then there is no SIMM installed in the slot 48.

In this case, processor 12 writes to the type/present controller as previously described to deassert the MEM_EN_1 signal and the EN_A<1:0> signals, thereby disabling the memory controller MEM_CTL_1 and placing the signal lines 87 routed to the slot 48 in a high impedance state.

If, on the other hand, the processor reads the register 201 and finds that the set of SIMM ID bits SID0<3:0> decodes to a 1 MB, 4 MB, or 16 MB SIMM, the decode indicates that a single-sided SIMM is present in the slot 48. The memory controller MEM_CTL_1 remains enabled but the processor writes to the type/present controller 88 to deassert the enable bit EN_A<1>, thereby placing the signal line 87 carrying the RAS_A<1> signal to the slot 48 in a high impedance state.

If, however, the set of SIMM ID bits SID0<3:0> decodes to a 2 MB, 8 MB, or 32 MB SIMM, then a double-sided SIMM is present in the slot 48 and 50. The enable signals EN_A<1:0> therefore remain asserted. The remaining slots 50, 52, and 54 are tested in exactly the same manner using their corresponding SIMM ID bits.

Figure 17:
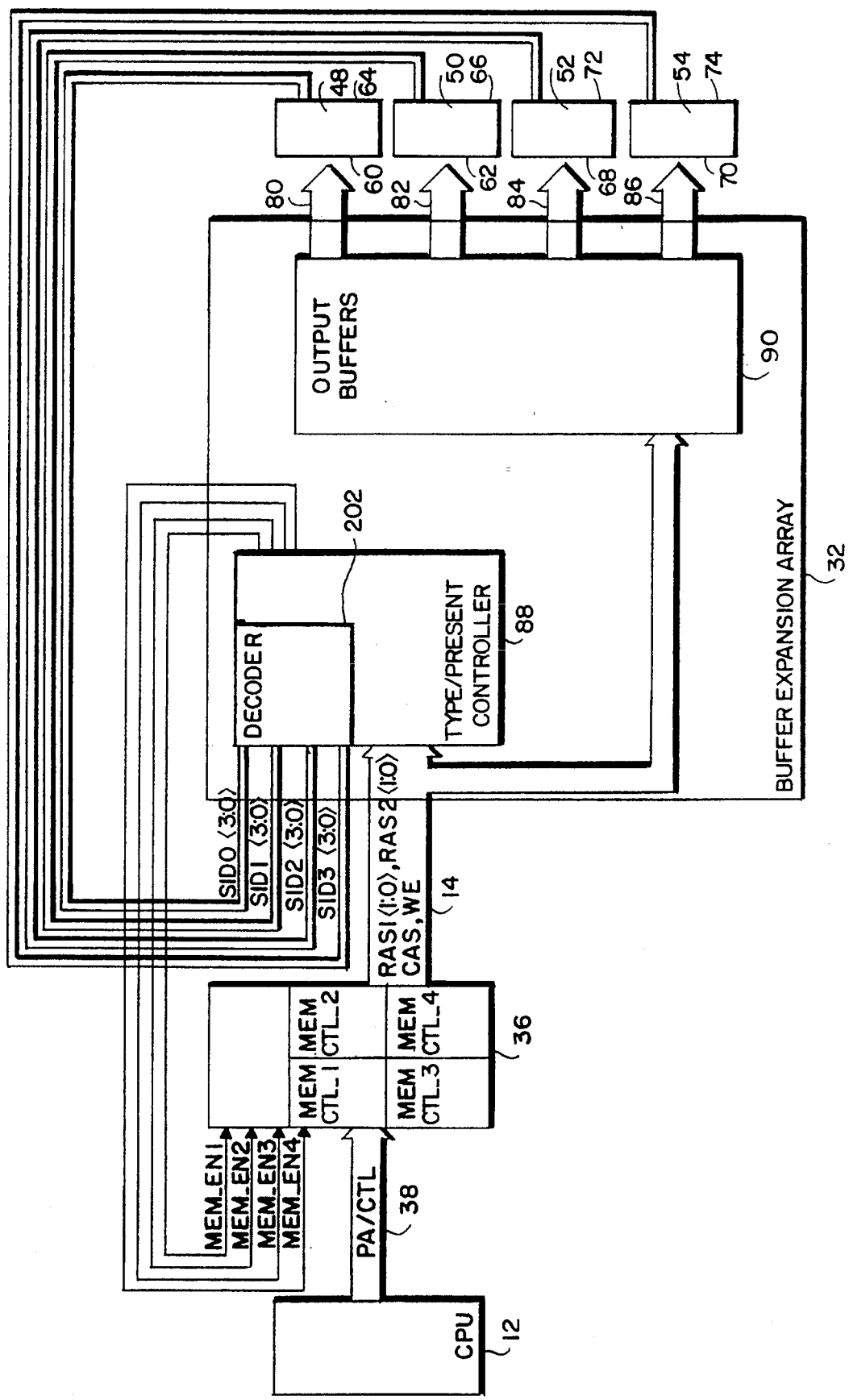
FIG. 17 is a is a block diagram of another embodiment of the buffer expansion array of FIG. 16.

The type/present controller 88 can use the SIMM ID bits which are provided on JEDEC industry standard SIMMs 40 in another manner in certain cases for determining if SIMMs 40 are installed in the slots 48, 50, 52, and 54. Referring now to FIG. 17, there is shown an embodiment of the buffer expansion array wherein SIMM ID bits are fed from the SIMMs 40 to a combinatorial logic decoder 202 within the type/present controller 88. Again, one set of SIMM ID bits is input to the decoder 202 for each SIMM; thus, SID<3:0> corresponds to SIMM slot 48; SID2<3:0> corresponds to SIMM slot 50, SID3<3:0> corresponds to SIMM slot 52; and SID3<3:0> corresponds to SIMM slot 54.

If the computer system 10 does not support the 8 MB 60 ns SIMM type, the presence or absence of SIMMs 40 in the slots 48, 50, 52, and 54 can be determined directly by the hardware. The decoder 202 within the type/present controller 88 decodes the SIMM ID bits for each slot to assert or deassert the driver enable signals EN_A<1:0>, EN_B<1:0>, EN_C<1:0>, and EN_D<1:0> to the drivers 96 and to assert or deassert the memory controller enable signals MEM_EN_1, MEM_EN_2, MEM_EN_3, and MEM_EN_4 to enable or disable the appropriate memory controllers MEM_CTL_1, MEM_CTL_2, MEM_CTL_3, and MEM_CTL_4.

For example, if the set of SIMM ID bits SID0<3:0> are all at a logic '0' level, then there is no SIMM installed in the slot 48. In this case, the decoder 202 deasserts the MEM_EN_1 signal, thereby disabling the memory controller MEM_CTL_1, and deasserts the enable signals EN_A<1:0>, thus placing the signal lines 87 routed to the slot 48 in a high impedance state.

If, on the other hand, the set of SIMM ID bits SID0<3:0> decodes to a 1 MB, 4 MB, or 16 MB SIMM, the decode indicates that a single-sided SIMM is present in the slot 48. The memory controller MEM_CTL_1 remains enabled but the enable bit EN_A<1> is deasserted by the decoder 202, thereby placing the signal line 87 carrying the RAS_A<1> signal to the slot 48 in a high impedance state.

If, however, the set of SIMM ID bits SID0<3:0> decodes to a 2 MB, 8 MB, or 32 MB SIMM, then a double-sided SIMM is present in the slot 48 and 50. The enable signals EN_A<1:0> therefore remain asserted. The remaining slots 50, 52, and 54 are tested in exactly the same manner using their corresponding SIMM ID bits.

Figure 15:
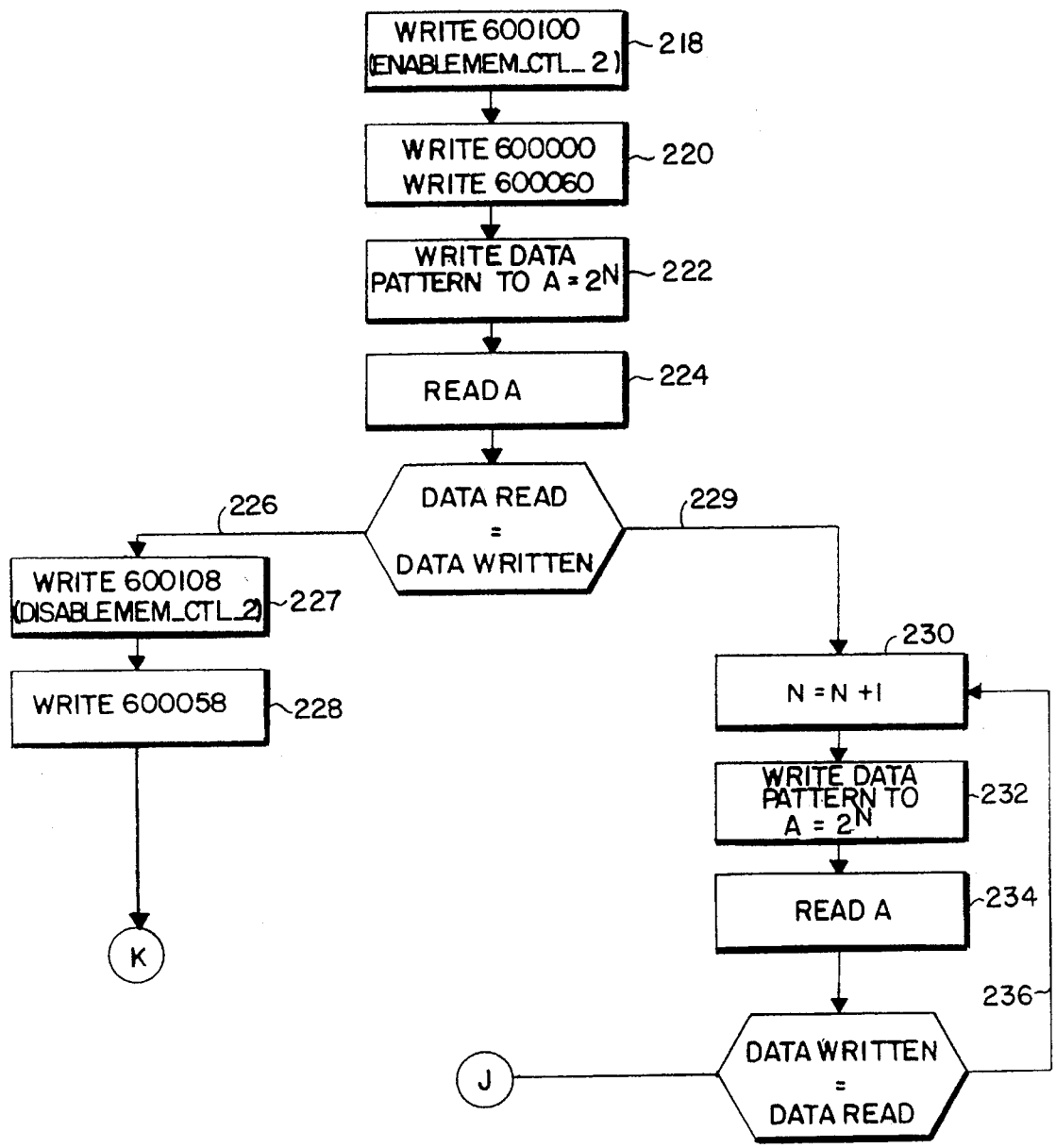
FIG. 15(a)–15(h) is a flow diagram of the operation of the type/present controller of FIG. 13.
Figure 15B:
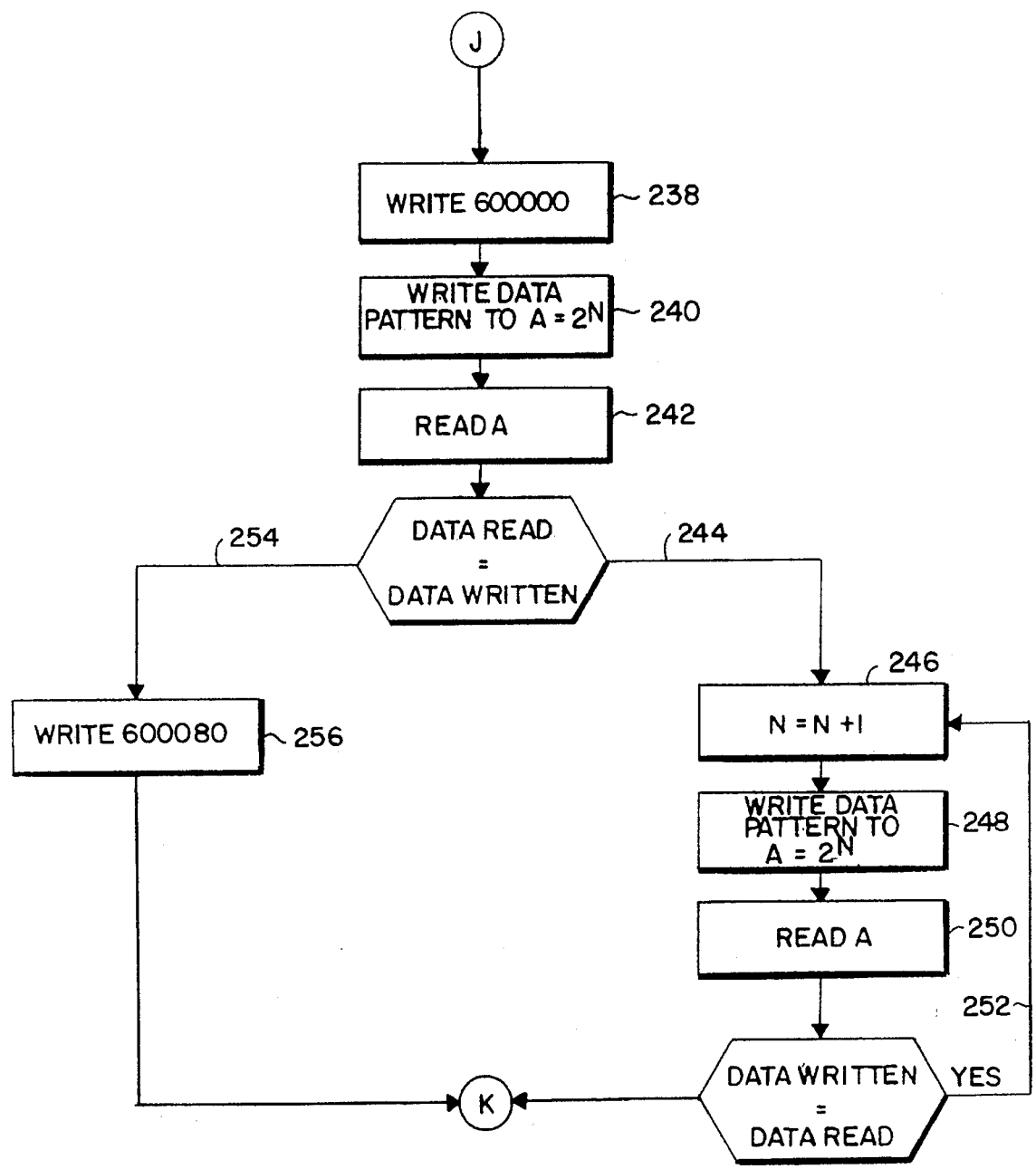
Figure 15C:
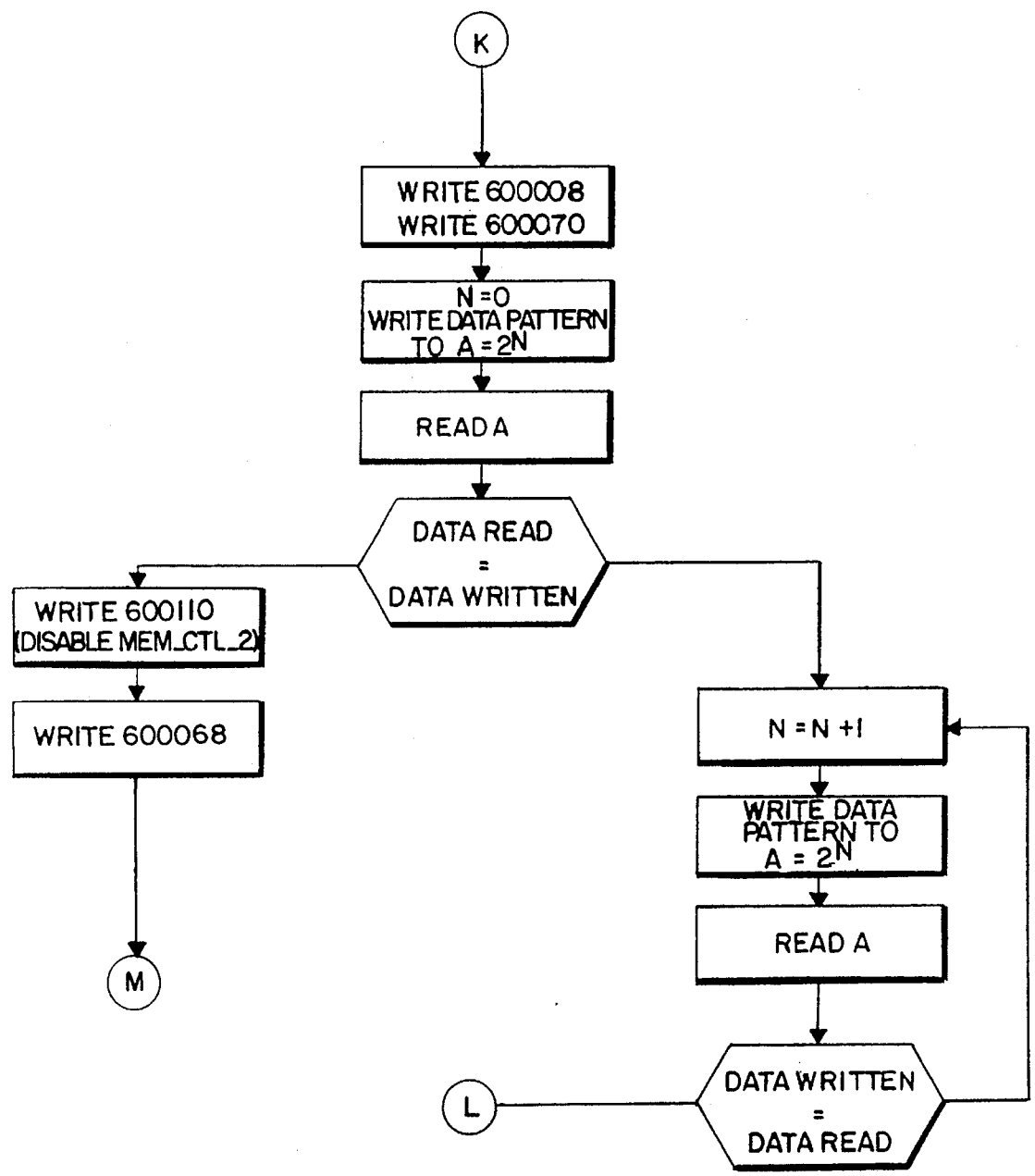
Figure 15D:
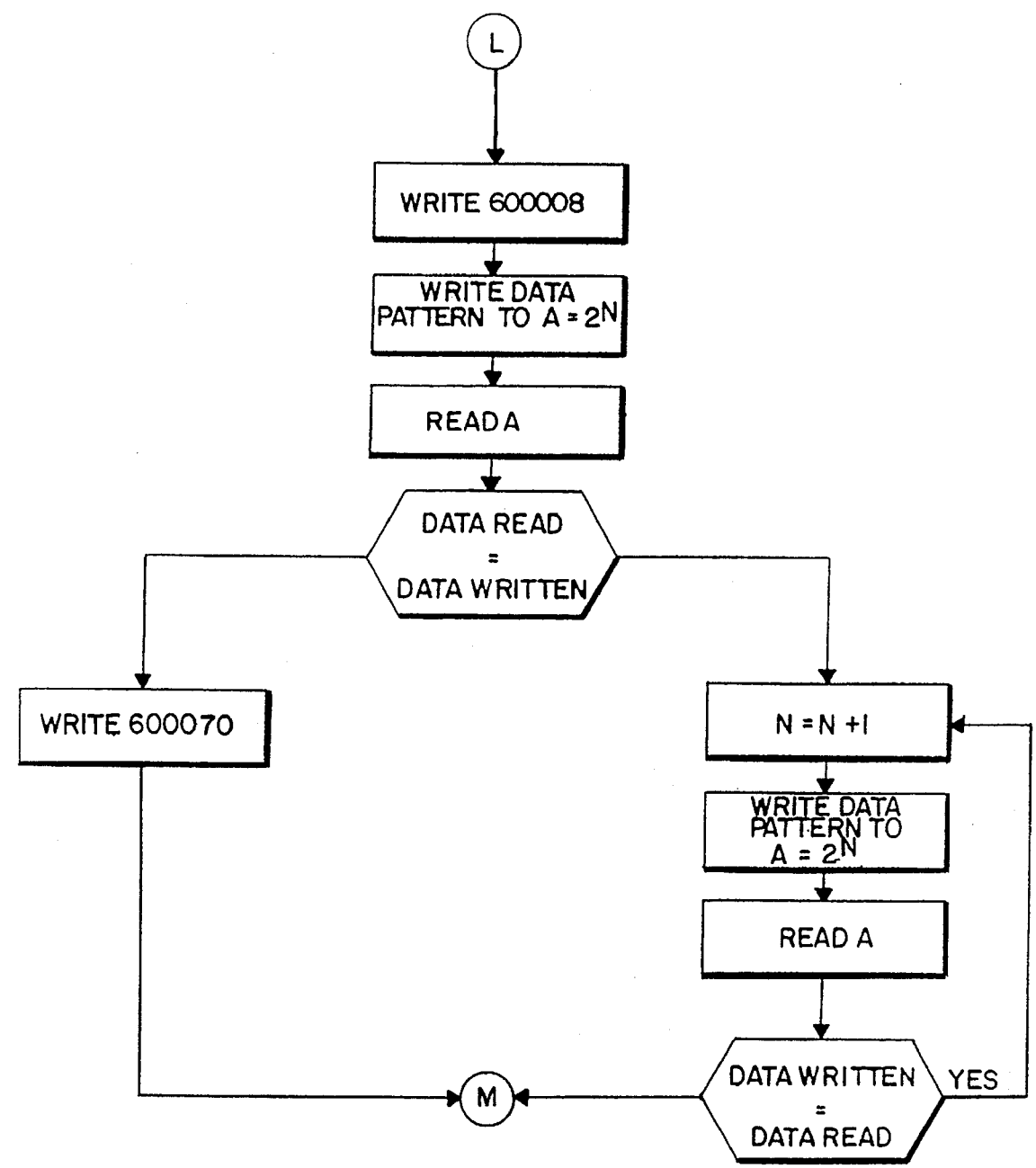
Figure 15E:
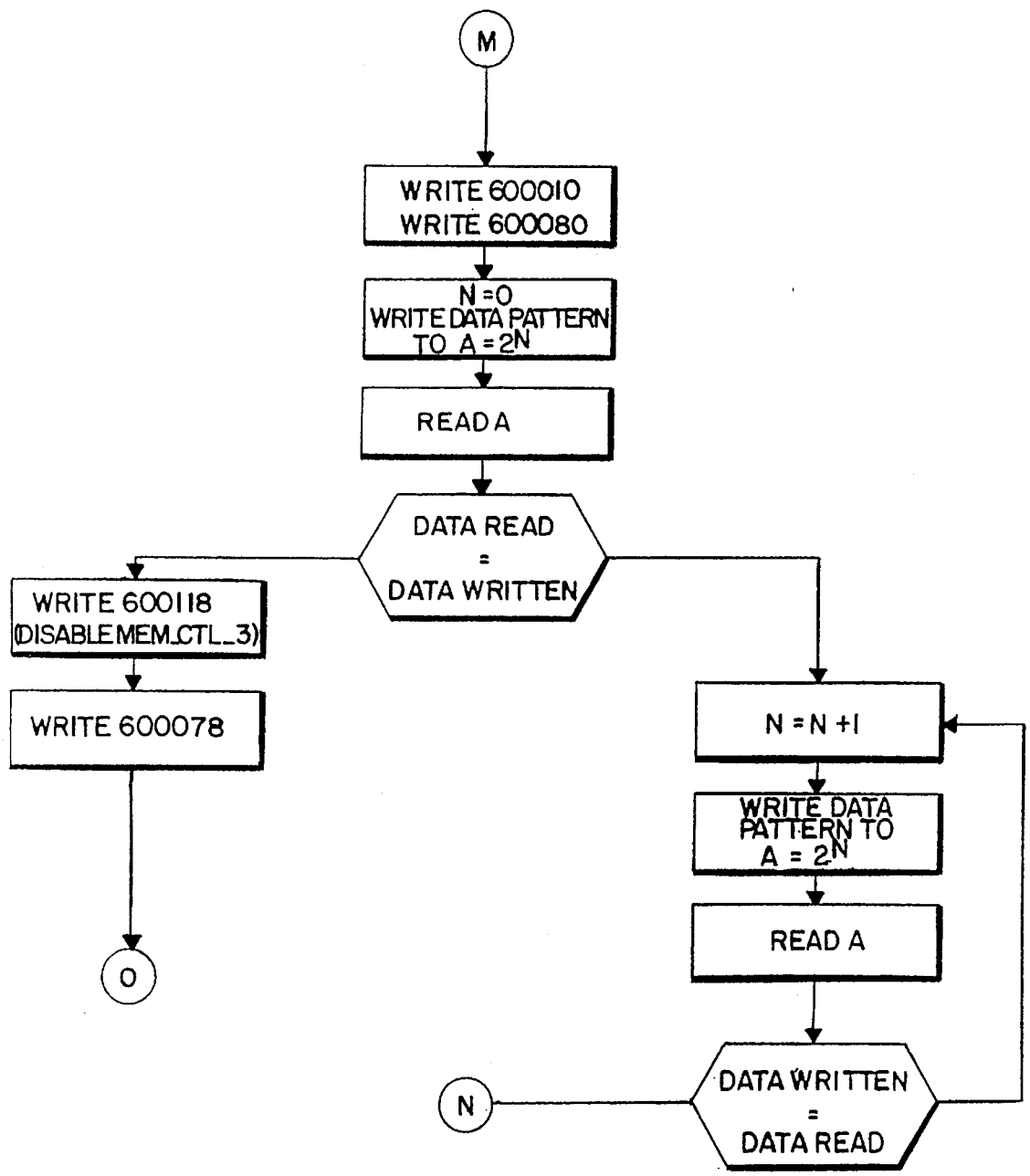
Figure 15F:
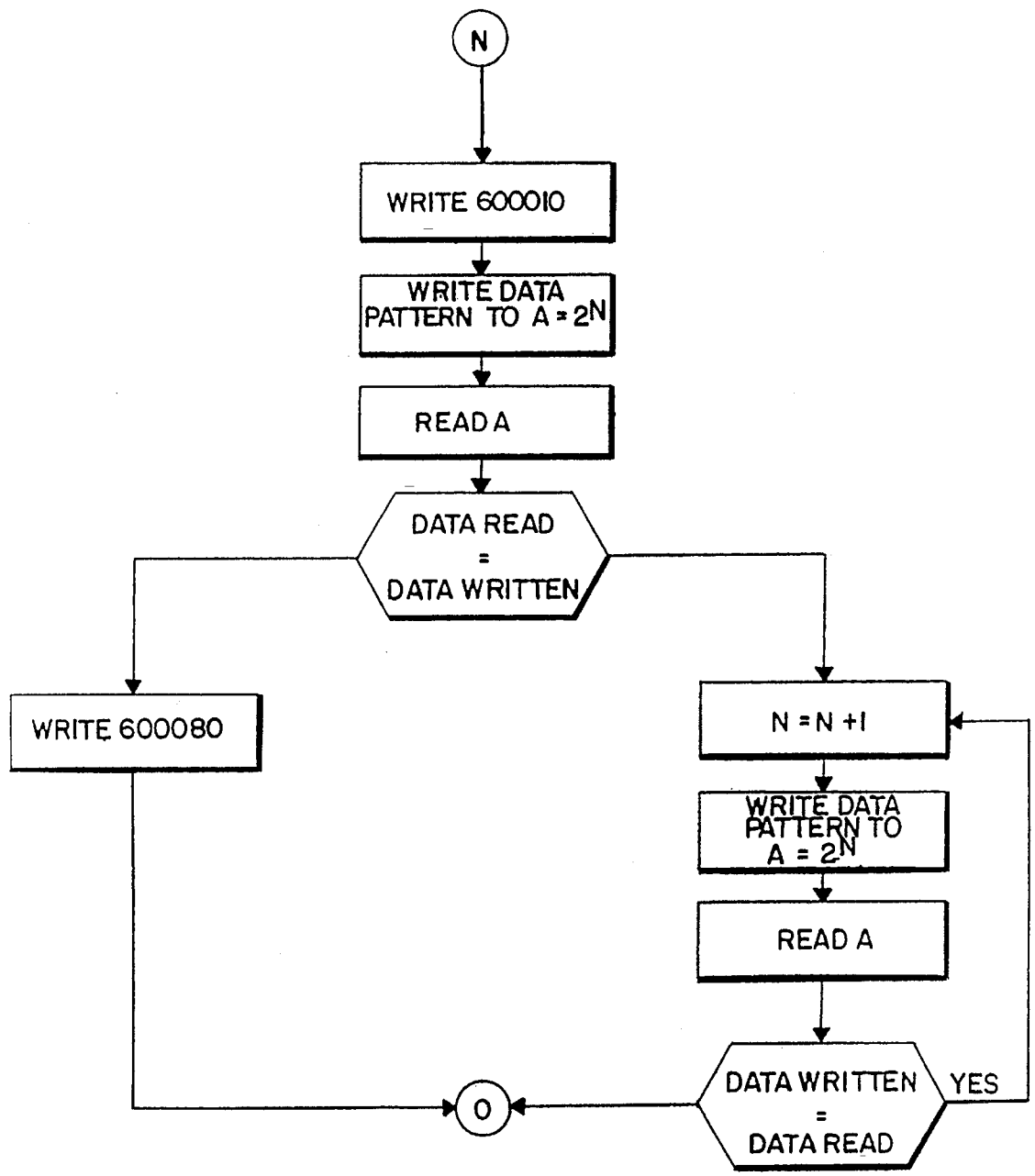
Figure 15G:
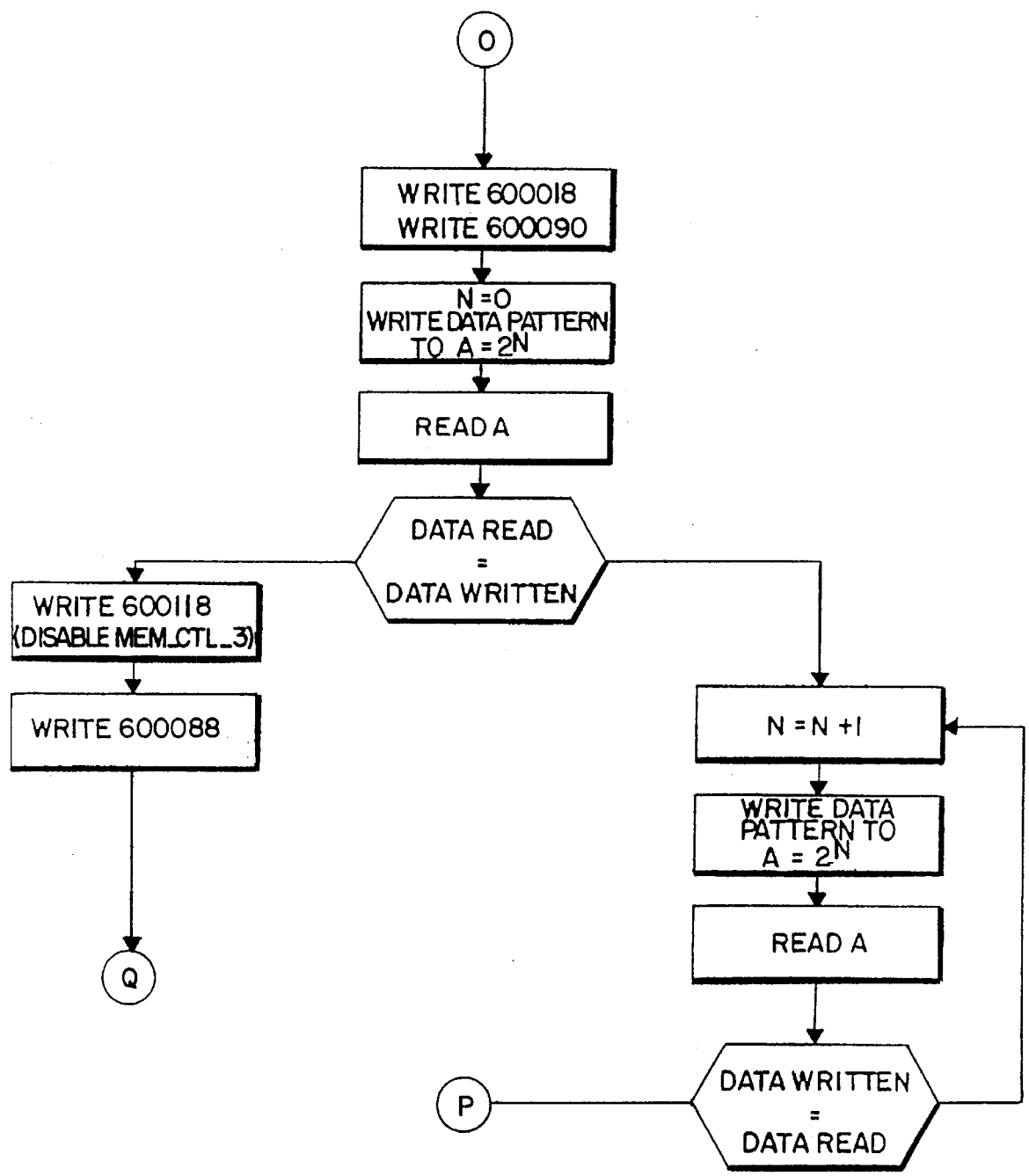
Figure 15H:
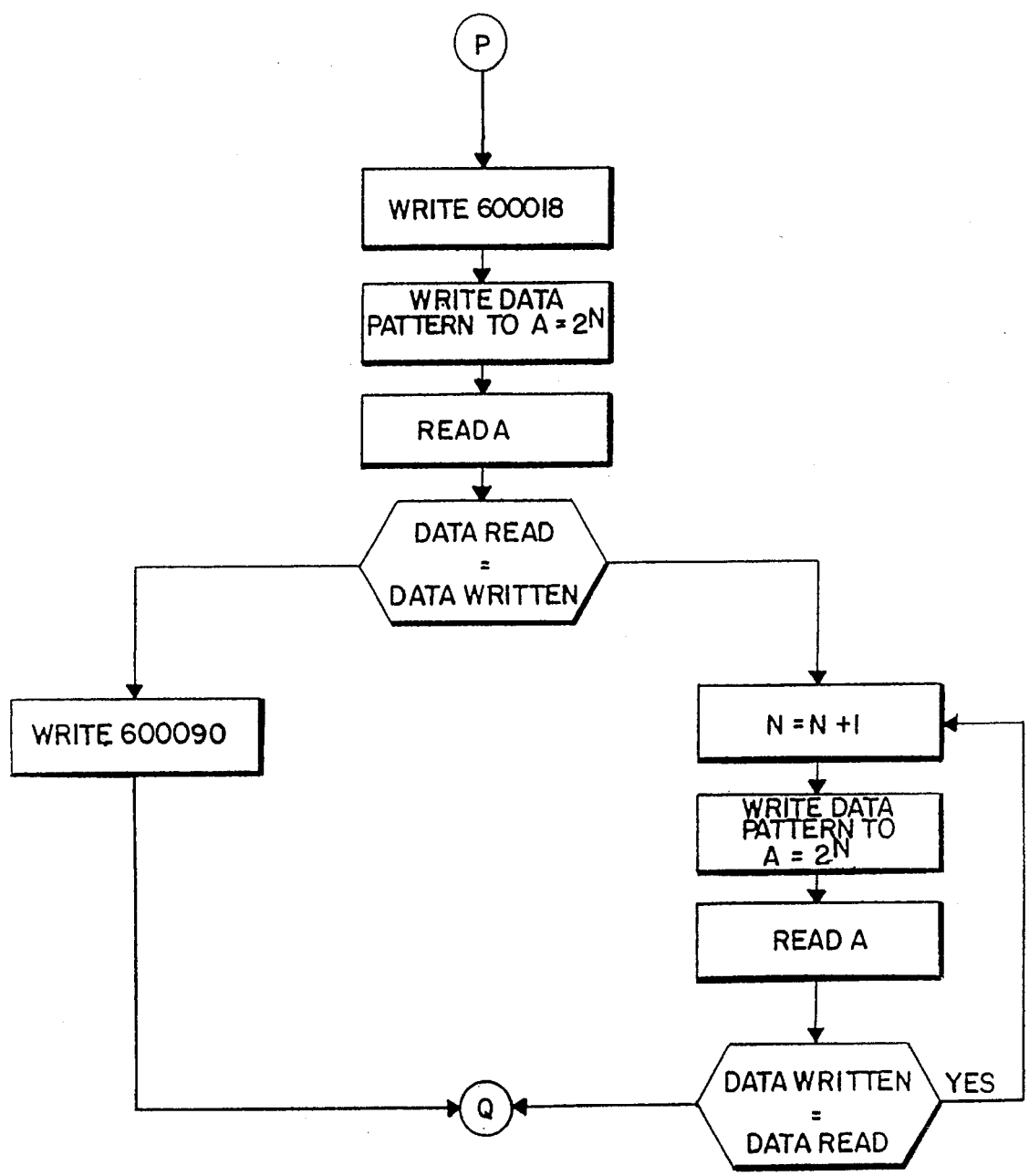

Finally, it should be noted that it is common for 32-bit computer systems 10 such as are shown in FIGS. 2 and 15 often require byte resolution for memory accesses. Thus, for example, there might be provided as part of the buffered memory address and control signals 80 the signals RAS_A<0><1:0>, RAS_A<1><1:0>, and CAS_A<3:0>. The RAS_A<0><1:0> signals could be enabled and disabled as previously described for the RAS_A<0> signal, but providing in addition that a word mask signal, or lower memory address bit, gate the enable signal EN_A<0> such that it is enabled as previously described and if the mask signal or memory address bit is in a particular state.

It is apparent that, within the scope of the invention, modifications and different arrangements may be made other than as herein disclosed. For example, in the embodiments previously described, only the RAS portions of the buffered memory control signals 34 were generated separately for each channel of a given slot. The invention contemplates, however, the provision of other separately generated signals for each channel. Furthermore, it should be noted that the principles of the present invention can be applied in systems supporting multiple devices other that SIMMs that may or may not be present. For example, it may be useful to provide separate drivers for each of a series of PCMCIA slots, wherein the drivers are enabled or disabled by a programmable disabling means based upon whether or not a PCMCIA option is plugged into the slot. The present disclosure is, therefore, merely illustrative, the invention comprehending all variations thereof.

What is claimed is:

1. An apparatus for providing signals to a Single In-Line Memory Module (SIMM) connector, the connector for accepting a SIMM having dynamic random access memories(DRAMs) mounted on one or two sides thereof, wherein the connector provides a channel of signals for each side of the SIMM, comprising:

a memory controller circuit producing memory address and control signals;

drivers each associated with one of the channels, each driver accepting as input one of the memory address and control signals, each driver driving as output a buffered memory signal to the associated channel via a corresponding signal line when that driver is in an enabled state and placing the corresponding signal line in a high impedance state when that driver is in a disabled state;

means coupled to the memory controller circuit for determining whether a SIMM is present in the connector; and programmable disabling means coupled to the memory controller circuit and being programmed according to memory address and control signals received from the memory controller circuit so as to place the drivers associated with the channels of the connector in the disabled state in response to a determination by the means for determining that no SIMM is present in the connector.

2. An apparatus for providing signals to a Single In-Line Memory Module (SIMM) connector, the SIMM connector for accepting a SIMM having dynamic random access memories (DRAMs) mounted on one or two sides thereof, wherein the SIMM connector provides a channel of signals for each side of the SIMM, comprising:

a memory controller circuit providing memory address and control signals;

drivers coupled to the memory controller circuit, each driver associated with one of the channels and accepting as input one of the memory address and control signals, each driver driving as output a buffered memory signal to the associated channel via a corresponding signal line when that driver is in an enabled state and placing the corresponding signal line in a high impedance state when that driver is in a disabled state;

means for determining whether a SIMM is present in the connector, the means for determining including a processor; and programmable disabling means coupled to the processor for placing the drivers associated with the channels of the connector in the disabled state in response to a determination that no SIMM is present in the connector, the programmable disabling means providing a driver enable signal to each driver, the programmable disabling means asserting one of the driver enable signals in response to a write to a first address location by the processor and deasserting one of the driver enable signals in response to a write to a second address location by the processor, each asserted driver enable signal placing the driver to which that asserted driver enable signal is provided in the enabled state and each deasserted driver enable signal placing the driver to which that deasserted driver enable signal is provided in the disabled state.

3. The apparatus of claim 2 wherein the processor is programmed to determine whether a SIMM is present in the SIMM connector by writing a data pattern to a memory address associated with one side of a SIMM, and then reading data from the memory address, and then comparing the data read to the data pattern written, and determining that no SIMM is present if the data read does not match the data pattern written, or determining that a SIMM is present if the data read does match the data pattern written.

4. The apparatus of claim 2 wherein the means for determining comprises:

a register receiving as input sets of SIMM ID signals, each set of SIMM ID signals being coupled between the connector and the register, the signals of a set being encoded to indicate whether a SIMM is present in the connector; and wherein the processor is programmed to determine whether a SIMM is present in the SIMM connector by reading the register.

5. An apparatus for providing signals to a Single In-Line Memory Module (SIMM) connector, the SIMM connector for accepting a SIMM having dynamic random access memories (DRAMs) mounted on one or two sides thereof, wherein the SIMM connector provides a channel of signals for each side of the SIMM, comprising:

a memory controller circuit providing memory address and control signals;

drivers coupled to the memory controller circuit, each driver associated with one of the channels and accepting as input one of the memory address and control signals, each driver driving as output a buffered memory signal to the associated channel via a corresponding signal line when that driver is in an enabled state and placing the corresponding signal line in a high impedance state when that driver is in a disabled state;

means for determining whether a SIMM is present in the connector and, when a SIMM is present in the connector, whether DRAMs are present on each side of that SIMM; and programmable disabling means, coupled to the means for determining, for placing the driver associated with one of the channels of the SIMM connector in the disabled state in response to a determination by the means for determining that a SIMM is present in the connector and that no DRAMs are present on the side of the SIMM to which the one of the channels corresponds.

6. The apparatus of claim 5 wherein the programmable disabling means is coupled to a processor and provides a driver enable signal to each driver, the programmable disabling means asserting one of the driver enable signals in response to a write to an address location by the processor and deasserting one of the driver enable signals in response to a write to another address location by the processor, each driver being in the enabled state when the corresponding driver enable signal is asserted and in the disabled state when the corresponding driver enable signal is deasserted.

7. The apparatus of claim 6 wherein said means for determining comprises the processor programmed to determine whether a SIMM is present in a connector by writing a data pattern to a memory address associated with one side of a SIMM, and then reading data from the memory address, and then comparing the data read to the data pattern written, and determining that no SIMM is present in the connector if the data read does not match the data pattern written, or determining that a SIMM is present in the connector if the data read does match the data pattern written, and programmed to determine, if a SIMM is present, whether DRAMs are present on each side of the SIMM by writing a data pattern to another memory address associated with the other side of the SIMM, and then reading data from the other memory address, and then comparing the data read to the data pattern written, and then determining that no DRAMs are present on the other side of the SIMM if the data read does not match the data pattern written, or determining that DRAMs are present on the other side of the SIMM if the data read does match the data pattern written.

8. The apparatus of claim 6 wherein the means for determining comprises:

a register receiving as input sets of SIMM ID signals, each set of SIMM ID signals being coupled between the connector and the register, the signals of a set being encoded to indicate whether a SIMM is present in the connector, and, if a SIMM is present in the connector, whether DRAMs are present on both sides of the SIMM; and the processor programmed to determine whether a SIMM is present in a SIMM connector, and, if a SIMM is present in the connector, whether DRAMs are present on both sides of the SIMM by reading the register.

9. An apparatus for providing signals to a Single In-Line Memory Module (SIMM) connector, the SIMM connector for accepting a SIMM having dynamic random access memories (DRAMs) mounted on one or two sides thereof, wherein the SIMM connector provides a channel of signals for each side of the SIMM, comprising:

a memory controller circuit including a plurality of memory controllers, each memory controller being associated with at least one channel, each memory controller producing memory address and control signals for the at least one channel when in an enabled state and not producing the memory address and control signals when in a disabled state;

drivers, each driver associated with one of the channels and accepting as input one of the memory address and control signals, each driver driving as output a buffered memory signal to the associated channel via a corresponding signal line when that driver is in the enabled state and placing the corresponding signal line in a high impedance state when that driver is in the disabled state;

means for determining whether a SIMM is present in the connector, the means for determining placing the memory controller associated with each channel of the connector in the disabled state if no SIMM is present in the connector; and programmable disabling means for placing the drivers associated with the channels of the connector in the disabled state in response to a determination by the means for determining that no SIMM is present in the connector.

10. The apparatus of claim 9 wherein the programmable disabling means places memory controllers associated with the channels of the connector in the disabled state in response to a determination by the means for determining that no SIMM is present in the connector.

11. The apparatus of claim 10 wherein the programmable disabling means provides a driver enable signal to each driver, the programmable disabling means asserting one of the driver enable signals in response to a write to a first address location by a processor and deasserting one of the driver enable signals in response to a write to a second address location by the processor, each driver being in the enabled state when the corresponding driver enable signal is asserted and in the disabled state when the corresponding driver enable signal is deasserted, and wherein the disabling means also provides a memory controller enable signal to each memory controller, the disabling means asserting one of the memory controller enable signals in response to a write to a third address location by the processor and deasserting one of the memory controller enable signals in response to a write to a fourth address location by the processor, each memory controller being in the enabled state when the corresponding memory controller enable signal is asserted and in the disabled state when the corresponding memory controller enable signal is deasserted.

12. The apparatus of claim 10 wherein said means for determining comprises a processor programmed to determine whether a SIMM is present in the SIMM connector by writing a data pattern to a memory address associated with one side of a SIMM, and then reading data from the memory address, and then comparing the data read to the data pattern written, and determining that no SIMM is present if the data read does not match the data pattern written, or determining that a SIMM is present if the data read does match the data pattern written.

13. The apparatus of claim 10 wherein the means for determining comprises:

a register receiving as input sets of SIMM ID signals, each set of SIMM ID signals being coupled between the connector and the register, the signals of a set being encoded to indicate whether a SIMM is present in the connector; and a processor programmed to determine whether a SIMM is present in the SIMM connector by reading the register.

14. The apparatus of claim 9 wherein the programmable disabling means places the drivers and memory controllers associated with the channels of the connector in the disabled state in response to a determination by the means for determining that no SIMM is present in the connector and places the driver and memory controller associated with one of the channels of the connector in the disabled state in response to a determination by the means for determining that a SIMM is present in the connector and no DRAMs are present on the side of the SIMM to which the one of the channels corresponds.

15. The apparatus of claim 14 wherein the programmable disabling means provides a driver enable signal to each driver, the programmable disabling means asserting one of the driver enable signals in response to a write to a first address location by a processor and deasserting one of the driver enable signals in response to a write to a second address location by the processor, each driver being in the enabled state when the corresponding driver enable signal is asserted and in the disabled state when the corresponding driver enable signal is deasserted, and wherein the disabling means also provides a memory controller enable signal to each memory controller, the disabling means asserting one of the memory controller enable signals in response to a write to a third address location by the processor and deasserting one of the memory controller enable signals in response to a write to a fourth address location by the processor, each memory controller being in the enabled state when the corresponding memory controller enable signal is asserted and in the disabled state when the corresponding memory controller enable signal is deasserted.

16. The apparatus of claim 14 wherein said means for determining comprises a processor programmed to determine whether a SIMM is present in the SIMM connector by writing a data pattern to a memory address associated with one side of a SIMM, and then reading data from the memory address, and then comparing the data read to the data pattern written, and determining that no SIMM is present if the data read does not match the data pattern written, or determining that a SIMM is present if the data read does match the data pattern written, and programmed to determine, if a SIMM is present, whether DRAMs are present on each side of the SIMM by writing a data pattern to another memory address associated with the other side of the SIMM, and then reading data from the other memory address, and then comparing the data read to the data pattern written, and then determining that no DRAMs are present on the other side of the SIMM if the data read does not match the data pattern written, or determining that DRAMs are present on the other side of the SIMM if the data read does match the data pattern written.

17. The apparatus of claim 14 wherein the means for determining comprises:

a register receiving as input sets of SIMM ID signals, each set of SIMM ID signals being coupled between the connector and the register, the signals of a set being encoded to indicate whether a SIMM is present in the connector, and if a SIMM is present in the connector, whether DRAMs are present on both sides of the SIMM; and a processor programmed to determine whether a SIMM is present in the SIMM connector, and, if a SIMM is present in the connector, whether DRAMs are present on both sides of the SIMM by reading the register.

18. An apparatus for providing signals to a Single In-Line Memory Module (SIMM) connector, the SIMM connector for accepting a SIMM having dynamic random access memories (DRAMs) mounted on one or two sides thereof, wherein the SIMM connector provides a channel of signals for each side of the SIMM, comprising:

a processor including a memory controller circuit having a plurality of memory controllers, each memory controller being associated with at least one channel, each memory controller producing memory address and control signals for the at least one channel when in an enabled state and not producing the memory address and control signals when in a disabled state;

drivers, each driver associated with one of the channels and accepting as input one of the memory address and control signals, each driver driving as output a buffered memory signal to the associated channel via a corresponding signal line when that driver is in the enabled state and placing the corresponding signal line in a high impedance state when that driver is in the disabled state;

means for determining whether a SIMM is present in the connector, the means for determining including the processor, the processor being programmed to determine whether a SIMM is present in the SIMM connector by writing a data pattern to a memory address associated with one side of the SIMM, and then reading data from the memory address, and then comparing the data read to the data pattern written, and determining that no SIMM is present if the data read does not match the data pattern written, or determining that the SIMM is present if the data read does match the data pattern written, and then disabling each memory controller associated with each channel of the connector if no SIMM is determined to be present in the connector; and programmable disabling means for placing the drivers associated with the channels of the connector in the disabled state in response to a determination by the means for determining that no SIMM is present in the connector.

19. The apparatus of claim 18 wherein the programmable disabling means places the drivers associated with the channels of the connector in the disabled state in response to a determination by the means for determining that no SIMM is present in the connector.

20. The apparatus of claim 19 wherein the programmable disabling means provides a driver enable signal to each driver, the programmable disabling means asserting one of the driver enable signals in response to a write to an address location by the processor and deasserting one of the driver enable signals in response to a write to another address location by the processor, each driver being in the enabled state when the corresponding driver enable signal is asserted and in the disabled state when the corresponding driver enable signal is deasserted.

21. The apparatus of claim 18 wherein the processor is also programmed to determine, if it has determined that a SIMM is present in the connector, whether DRAMs are present on both sides of the SIMM by writing a data pattern to another memory address associated with the other side of the SIMM, and then reading data from the other memory address, and then comparing the data read to the data pattern written, and then determining that no DRAMs are present on the other side of the SIMM if the data read does not match the data pattern written, or determining that DRAMs are present on the other side of the SIMM if the data read does match the data pattern written, and then placing the memory controller associated with one of the channels of the connector in the disabled state if it is determined that no DRAMs are present on the side of the SIMM to which the channel corresponds.

22. The apparatus of claim 21 wherein the programmable disabling means places the drivers associated with the channels of the connector in the disabled state in response to a determination by the means for determining that no SIMM is present in the connector and places the driver associated with one of the channels of the connector in the disabled state in response to a determination by the means for determining that a SIMM is present in the connector and no DRAMs are present on the side of the SIMM to which the channel corresponds.

23. The apparatus of claim 22 wherein the programmable disabling means provides a driver enable signal to each driver, the programmable disabling means asserting one of the driver enable signals in response to a write to an address location by the processor and deasserting one of the driver enable signals in response to a write to another address location by the processor, each driver being in the enabled state when the corresponding driver enable signal is asserted and in the disabled state when the corresponding driver enable signal is deasserted.

24. An apparatus for providing signals to Single In-Line Memory Module (SIMM) connectors, the connectors accepting SIMMs having DRAMs mounted on one or two sides thereof, wherein each connector provides a channel of signals for each side of a SIMM, comprising:

a memory controller circuit comprising a plurality of memory controllers each associated with at least one channel, each memory controller producing address and control signals for the at least one channel when in an enabled state and not producing said address and control signals when in a disabled state;

drivers each associated with a channel, each driver accepting as input a memory address and control signal, each driver driving as output a buffered memory address and control signal to the associated channel via a corresponding signal line when in an enabled state and placing the corresponding signal line in a high impedence state when in a disabled state;

means for determining comprising a processor programmed to determine whether a SIMM is present in a connector by writing a data pattern to a memory address associated with one side of a SIMM, and then reading data from the memory address, and then comparing the data read to the data pattern written, and determining that no SIMM is present in the connector if the data read does not match the data pattern written, or determining that a SIMM is present in the connector if the data read does match the data pattern written, and programmed to determine, if a SIMM is present, whether DRAMs are present on each side of the SIMM by writing a data pattern to another memory address associated with the other side of the SIMM, and then reading data from the other memory address, and then comparing the data read to the data pattern written, and then determining that no DRAMs are present on the other side of the SIMM if the data read does not match the data pattern written, or determining that DRAMs are present on the other side of the SIMM if the data read does match the data pattern written;

programmable disabling means responsive to the means for determining for placing the drivers and the memory controllers associated with each channel of the connector in the disabled state when the means for determining determines that no SIMM is present in the connector, and for placing the driver and the memory controller associated with a channel of the connector in the disabled state when the means for determining determines that a SIMM is present in the connector and no DRAMs are present on the side of the SIMM to which the channel corresponds, the disabling means providing driver enable signals coupled to each driver, the disabling means being programmable by the processor, the disabling means asserting each driver enable signal in response to a write to an address location by the processor and deasserting the driver enable signal in response to a write to another address location by the processor, each driver being in the enabled state when the corresponding driver enable signal is asserted and in the disabled state when the corresponding driver enable signal is deasserted, the disabling means also providing memory controller enable signals coupled to each memory controller, the disabling means asserting each memory controller enable signal in response to a write to an address location by the processor and deasserting the memory controller enable signal in response to a write to another address location by the processor, each memory controller being in the enabled state when the corresponding memory controller enable signal is asserted and in the disabled state when the corresponding memory controller enable signal is deasserted.

25. An apparatus for providing signals to Single In-Line Memory Module (SIMM) connectors, the connectors accepting SIMMs having DRAMs mounted on one or two sides thereof, wherein each connector provides a channel of signals for each side of a SIMM, comprising:

a memory controller circuit comprising a plurality of memory controllers each associated with at least one channel, each memory controller producing address and control signals for the at least one channel when in an enabled state and not producing said address and control signals when in a disabled state;

drivers each associated with a channel, each driver accepting as input a memory address and control signal, each driver driving as output a buffered memory address and control signal to the associated channel via a corresponding signal line when in an enabled state and placing the corresponding signal line in a high impedence state when in a disabled state;

a register receiving as input sets of SIMM ID signals, each set of SIMM ID signals being coupled between a corresponding connector and the register, the signals of a set being encoded to indicate whether a SIMM is present in the corresponding connector, and, if a SIMM is present in the connector, whether DRAMs are present on both sides of the SIMM;

a processor programmed to determine whether a SIMM is present in a SIMM connector, and, if a SIMM is present in the connector, whether DRAMs are present on both sides of the SIMM by reading the register; and programmable disabling means responsive to the means for determining for placing the drivers and the memory controllers associated with each channel of the connector in the disabled state when the means for determining determines that no SIMM is present in the connector, and for placing the driver and the memory controller associated with a channel of the connector in the disabled state when the means for determining determines that a SIMM is present in the connector and no DRAMs are present on the side of the SIMM to which the channel corresponds, the disabling means providing driver enable signals coupled to each driver, the disabling means being programmable by the processor, the disabling means asserting each driver enable signal in response to a write to an address location by the processor and deasserting the driver enable signal in response to a write to another address location by the processor, each driver being in the enabled state when the corresponding driver enable signal is asserted and in the disabled state when the corresponding driver enable signal is deasserted, the disabling means also providing memory controller enable signals coupled to each memory controller, the disabling means asserting each memory controller enable signal in response to a write to an address location by the processor and deasserting the memory controller enable signal in response to a write to another address location by the processor, each memory controller being in the enabled state when the corresponding memory controller enable signal is asserted and in the disabled state when the corresponding memory controller enable signal is deasserted.

26. An apparatus for providing signals to Single In-Line Memory Module (SIMM) connectors, the connectors accepting SIMMs having DRAMs mounted on one or two sides thereof, wherein each connector provides a channel of signals for each side of a SIMM, comprising:

a processor comprising a memory controller circuit including a plurality of memory controllers each associated with at least one channel, each memory controller producing address and control signals for the at least one channel when in an enabled state and not producing said address and control signals when in a disabled state, the processor programmed to determine whether a SIMM is present in a SIMM connector by writing a data pattern to a memory address associated with one side of a SIMM, and then reading data from the memory address, and then comparing the data read to the data pattern written, and determining that no SIMM is present if the data read does not match the data pattern written, or determining that a SIMM is present if the data read does match the data pattern written, and then placing the memory controller associated with each channel of the connector in the disabled state if it is determined that no SIMM is present in the connector, the processor further programmed to determine, if it has determined that a SIMM is present in a connector, whether DRAMs are present on both sides of the SIMM by writing a data pattern to another memory address associated with the other side of the SIMM, and then reading data from the other memory address, and then comparing the data read to the data pattern written, and then determining that no DRAMs are present on the other side of the SIMM if the data read does not match the data pattern written, or determining that DRAMs are present on the other side of the SIMM if the data read does match the data pattern written, and then placing the memory controller associated with one of the channels of the connector in the disabled state if it is determined that no DRAMs are present on the side of the SIMM to which the channel corresponds;

drivers each associated with a channel, each driver accepting as input a memory address and control signal, each driver driving as output a buffered memory address and control signal to the associated channel via a corresponding signal line when in an enabled state and placing the corresponding signal line in a high impedence state when in a disabled state;

programmable disabling means coupled to the processor for placing the drivers associated with each channel of the connector in the disabled state when the processor determines that no SIMM is present in the connector, and for placing the driver associated with one of the channels of the connector in the disabled state when the processor determines that a SIMM is present in the connector and no DRAMs are present on the side of the SIMM to which the channel corresponds, the disabling means providing driver enable signals coupled to each driver, the disabling means asserting each driver enable signal in response to a write to an address location by the processor and deasserting the driver enable signal in response to a write to another address location by the processor, each driver being in the enabled state when the corresponding driver enable signal is asserted and in the disabled state when the corresponding driver enable signal is deasserted.

27. An apparatus for providing signals to Single In-Line Memory Module (SIMM) connectors, the connectors accepting SIMMs having DRAMs mounted on one or two sides thereof, wherein each connector provides a channel of signals for each side of a SIMM, comprising:

a memory controller circuit producing memory address and control signals;

drivers each associated with one of the channels, each driver accepting as input one of the memory address and control signals, each driver driving as output a buffered memory signal to the associated channel via a corresponding signal line when in an enabled state and placing the corresponding signal line in a high impedence state when in a disabled state;

means for indicating whether a SIMM is present in the connector and, if so, whether DRAMs are present on both sides of the SIMM;

a decoder responsive to the means for indicating, the decoder producing as output driver enable signals each coupled to a driver, the driver being in the enabled state when the driver enable signal is asserted and in the disabled state when the driver enable signal is deasserted, the decoder deasserting the driver enable signal for a channel if the means for indicating indicates that no SIMM is present in the connector or indicates that a SIMM is present in the connector and no DRAMs are present on the side of the SIMM to which the channel corresponds, the decoder asserting the driver enable signal if the means for indicating indicates that a SIMM is present in the connector and DRAMs are present on the side of the SIMM to which the associated channel corresponds.

28. The apparatus of claim 27 wherein the means for indicating comprises sets of SIMM ID signals, each set of SIMM ID signals being coupled between a corresponding connector and the decoder, the signals of a set being encoded to indicate whether a SIMM is present in the corresponding connector, and, if a SIMM is present in the connector, whether DRAMs are present on both sides of the SIMM.

29. The apparatus of claim 27 wherein the memory controller circuit comprises a plurality of memory controllers each associated with at least one channel, each memory controller producing address and control signals for the at least one channel when in an enabled state and not producing said address and control signals when in a disabled state, and wherein the decoder further produces as output memory controller enable signals each coupled to one of the memory controllers, each memory controller being in the enabled state when the corresponding memory controller enable signal is asserted and in the disabled state when the corresponding memory controller enable signal is deasserted, the decoder deasserting the memory controller enable signal for a memory controller associated with a channel corresponding to the connector if the means for indicating indicates that no SIMM is present in the connector or indicates that a SIMM is present in the connector and no DRAMs are present on the side of the SIMM to which the channel corresponds, the decoder asserting the memory controller enable signal for the memory controller associated with the channel corresponding to the connector if the means for indicating indicates that a SIMM is present in the connector and DRAMs are present on the side of the SIMM to which the channel corresponds.

30. The apparatus of claim 29 wherein the means for indicating comprises sets of SIMM ID signals, each set of SIMM ID signals being coupled between a corresponding connector and the decoder, the signals of a set being encoded to indicate whether a SIMM is present in the corresponding connector, and, if a SIMM is present in the connector, whether DRAMs are present on both sides of the SIMM.

31. An apparatus for providing signals to Single In-Line Memory Module (SIMM) connectors, the connectors accepting SIMMs having DRAMs mounted on one or two sides thereof, wherein each connector provides a channel of signals for each side of a SIMM, comprising:

a memory controller circuit comprising a plurality of memory controllers each associated with at least one channel, each memory controller producing address and control signals for the at least one channel when in an enabled state and not producing said address and control signals when in a disabled state;

drivers each associated with a channel, each driver accepting as input a memory address and control signal, each driver driving as output a buffered memory address and control signal to the associated channel via a corresponding signal line when in an enabled state and placing the corresponding signal line in a high impedence state when in a disabled state;

sets of SIMM ID signals, each set of SIMM ID signals being coupled between a corresponding connector and the decoder, the signals of a set being encoded to indicate whether a SIMM is present in the corresponding connector, and, if a SIMM is present in the connector, whether DRAMs are present on both sides of the SIMM;

a decoder responsive to the sets of SIMM ID signals, the decoder producing as output driver enable signals each coupled to a driver, the driver being in the enabled state when the driver enable signal is asserted and in the disabled state when the driver enable signal is deasserted, the decoder deasserting the driver enable signal for a channel if the set of SIMM ID signals corresponding to the connector to which the channel corresponds indicates that no SIMM is present in the connector or indicates that a SIMM is present in the connector and no DRAMs are present on the side of the SIMM to which the channel corresponds, the decoder asserting the driver enable signal if the set of SIMM ID signals corresponding to the connector to which the channel corresponds indicates that a SIMM is present in the connector and DRAMs are present on the side of the SIMM to which the associated channel corresponds, the decoder further producing as output memory controller enable signals each coupled to a memory controller, each memory controller being in the enabled state when the corresponding memory controller enable signal is asserted and in the disabled state when the corresponding memory controller enable signal is deasserted, the decoder deasserting the memory controller enable signal for the memory controller associated with a channel if the set of SIMM ID signals corresponding to the connector to which the channel corresponds indicates that no SIMM is present in the connector or indicates that a SIMM is present in the connector and no DRAMs are present on the side of the SIMM to which the channel corresponds, the decoder asserting the memory controller enable signal for the memory controller associated with the channel if the set of SIMM ID signals corresponding to the connector to which the channel corresponds indicates that a SIMM is present in the connector and DRAMs are present on the side of the SIMM to which the channel corresponds.

* * * * *